(12) United States Patent
Mandal et al.

(10) Patent No.: US 8,498,366 B2
(45) Date of Patent: Jul. 30, 2013

(54) ARCHITECTURES FOR UNIVERSAL OR SOFTWARE RADIO

(75) Inventors: Soumyajit Mandal, Cambridge, MA (US); Serhii M. Zhak, Andover, MA (US); Rahul Sarpeshkar, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/352,818

(22) Filed: Jan. 18, 2012

(65) Prior Publication Data

US 2012/0114081 A1    May 10, 2012

Related U.S. Application Data

(63) Continuation of application No. 11/958,990, filed on Dec. 18, 2007, now Pat. No. 8,121,223.

(60) Provisional application No. 60/870,719, filed on Dec. 19, 2006.

(51) Int. Cl.
*H04L 27/06* (2006.01)

(52) U.S. Cl.
USPC ........... 375/340; 375/350; 375/344; 375/349; 455/136; 455/150.1; 455/164.2; 455/182.2; 455/192.2; 455/234.2; 455/240.1; 455/241.1; 455/245.1; 455/247.1; 455/250.1

(58) Field of Classification Search
USPC ............. 455/136, 150.1, 164.2, 182.2, 192.2, 455/234.2, 240.1, 241.1, 245.1, 247.1, 250.1; 375/344, 350, 340, 349
See application file for complete search history.

(56) References Cited

U.S. PATENT DOCUMENTS

| 4,598,422 | A | * | 7/1986 | Fellman ..................... 455/180.1 |
| 5,646,935 | A | * | 7/1997 | Ishikawa et al. .............. 370/207 |
| 6,035,213 | A | | 3/2000 | Tokuda et al. |
| 2002/0006174 | A1 | | 1/2002 | Nafie et al. |
| 2003/0021367 | A1 | | 1/2003 | Smith |
| 2005/0190861 | A1 | | 9/2005 | Okanobu |
| 2005/0190867 | A1 | | 9/2005 | Sobchak et al. |

FOREIGN PATENT DOCUMENTS

JP    2006-060386    3/2006

OTHER PUBLICATIONS

Partial PCT Search Report received with Invitation to Pay Additional Fees in PCT/US2007/087925 dated May 26, 2008.
PCT Search Report and Written Opinion of the ISA for PCT/US2007/087925 dated Jun. 25, 2008.
PCT International Preliminary Report on Patentability dated Jul. 2, 2009.
U.S. Appl. No. 11/958,990, filed Dec. 18, 2007.

* cited by examiner

*Primary Examiner* — Daniel Washburn
*Assistant Examiner* — Rahel Guarino
(74) *Attorney, Agent, or Firm* — Daly, Crowley, Mofford & Durkee, LLP

(57) ABSTRACT

A system and technique for providing to flexible, programmable frequency estimators and spectrum analyzers that can operate over extremely large bandwidths and yet provide high spectral resolution are described. The system and technique may include a cascaded super-heterodyne apparatus for estimating a frequency and a bandwidth of signals proximate in frequency to a desired signal, a tunable filter coupled to an input of a receiver, and a tuner which receives a signal from said cascaded super-heterodyne apparatus and tunes the filter to filter out unwanted signals from the receiver.

22 Claims, 22 Drawing Sheets

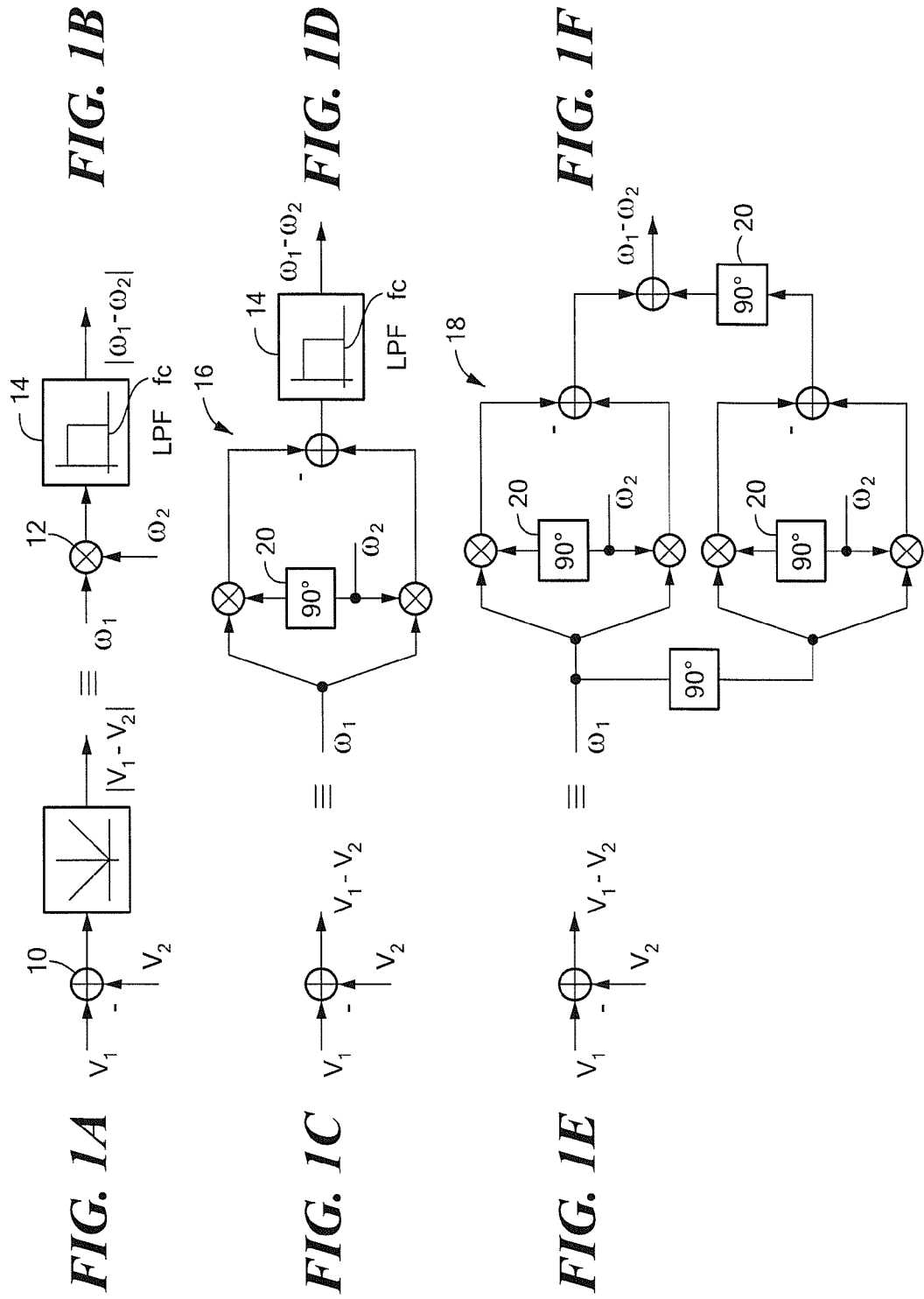

ARCHITECTURES FOR UNIVERSAL OR SOFTWARE RADIO

CROSS REFERENCE TO RELATED APPLICATIONS

This application is a continuation of pending application Ser. No. 11/958,990 filed Dec. 18, 2007, which claims priority to U.S. Provisional Application No. 60/870,719 filed Dec. 19, 2006 entitled "Architectures For Universal Or Software Radio," which applications are both hereby incorporated herein by reference in their entireties.

STATEMENT REGARDING FEDERALLY SPONSORED RESEARCH

Not Applicable.

FIELD OF THE INVENTION

This invention relates generally to circuits and techniques to provide frequency estimators and spectrum analyzers and more particularly to circuits and techniques for providing programmable frequency estimators and spectrum analyzers which provide high spectral resolution over large frequency bandwidths.

BACKGROUND OF THE INVENTION

As is known in the art, the commercially interesting range of frequencies for wireless applications is very large, extending over approximately three orders of magnitude from about 100 MHz to about 100 GHz. Nevertheless, this resource (i.e. the range of available frequencies and frequency bands) is becoming increasingly crowded. Next-generation radios will need to be smart enough to be able to find any available space in the RF spectrum, and flexible enough to be able to operate there.

Furthermore, some next-generation radios may need to serve as translator or gateway radios in a heterogeneous wireless network. Gateway radios receive signals in different formats and frequencies from input radios, translate them to other formats and then transmit them to other radios. Previous attempts to build such software, universal or cognitive radios have only operated over limited frequency ranges. They have also suffered from high power consumption because digitizing the entire input signal bandwidth immediately following the antenna is energy-inefficient.

SUMMARY OF THE INVENTION

In accordance with the present invention, an analogy between frequency estimators and analog-to-digital converters (ADCs) has been recognized. This analogy has been used to develop new frequency estimation algorithms based upon well-known ADC algorithms. It has also been recognized, in accordance with the present invention, that frequency estimators and ADCs solve similar problems, but in different signal domains. In particular, ADCs find the value of an unknown analog signal amplitude (voltage or current) while frequency estimators do the same with an analog frequency variable. As a result, similar solution techniques work in the two cases. In particular, it has been recognized that ADC algorithms and automatic error-calibration techniques can be adapted for frequency estimation. However, a signal can have many instantaneous frequencies of interest, but only one instantaneous amplitude. A better analogy is therefore to view frequency estimators as the frequency-domain analogs of multiple parallel ADCs. Each ADC corresponds to estimating the frequency value (and possibly the power content) of one output bin. The recognition of these analogies between ADCs and frequency estimators enables one to search for frequency-domain analogs of most well-known ADC topologies. Using this approach, several new circuits and techniques for frequency estimation are described.

Accordingly, frequency analysis and estimation techniques which permit only desired portions of a frequency spectrum to be selected and digitized are described. The techniques are based upon a new understanding of the conceptual similarities between voltage estimators, i.e., analog-to-digital converters, and frequency estimators. Their use results in universal radios which have the following advantages over current implementations: (1) wide fractional bandwidth combined with high temporal resolution; (2) fast signal acquisition; (3) increased agility and programmability; (4) low power consumption; and (5) low hardware complexity.

A flexible, programmable frequency estimator operable to provide high spectral resolution over extremely large frequency bandwidths is also described. In one preferred embodiment, the architectures are implemented using exponentially-tapered transmission lines and filter cascades.

It should be appreciated that the acquisition time and hardware complexity of the circuits described herein scale as $O(N)$, where N denotes the number of frequency bins acquired.

A flexible, programmable spectrum analyzer operable to provide high spectral resolution over extremely large frequency bandwidths is also described. In one preferred embodiment, the architectures are implemented using exponentially-tapered transmission lines and filter cascades.

It should be appreciated that the circuits and techniques described herein can be used in a wide variety of applications including, but not limited to, universal and software radios and radar.

BRIEF DESCRIPTION OF THE DRAWINGS

The foregoing features of this invention, as well as the invention itself, may be more fully understood from the following description of the drawings in which:

FIGS. 1A and 1B are pair of circuit diagrams which illustrate the difference in operations between analog-to-digital converters (FIG. 1A) and frequency estimators (FIG. 1B) with real input signals;

FIGS. 1C and 1D are pair of circuit diagrams which illustrate the difference in operations between analog-to-digital converters (FIG. 1C) and frequency estimators (FIG. 1D) with complex input signals.

FIGS. 1E and 1F are pair of circuit diagrams which illustrate the difference in operations between analog-to-digital converters (FIG. 1E) and frequency estimators (FIG. 1F) with complex input signals.

DETAILED DESCRIPTION OF THE PREFERRED EMBODIMENTS

Figure 2A:
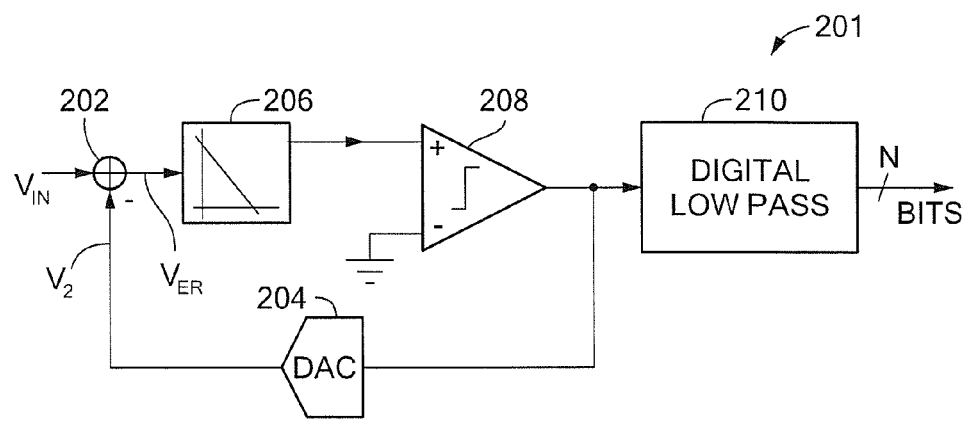
FIG. 2A illustrates a sigma-delta architectures for analog-to-digital conversion.

In an effort to promote clarity in the text describing the concepts disclosed herein, specific reference is sometimes made hereinbelow to specific systems such as radar systems or software radios. Such references are not intended to be and should not be construed as limiting the scope of the disclosure. Rather, it should be appreciated that the below described systems and techniques find application in a wide variety of applications including but limited to software-defined, programmable, universal or cognitive radio, spectrum analyzers, frequency estimators, ultra-wideband systems, and biologically-inspired systems. Thus, the architectures, algorithms and/or hardware described herein may be used in any of the following applications: low-power universal radio for translating between protocols used by any two existing radios, for example cell phones and military radios; adaptive long-range radio networks that include at least one universal radio and automatically adapt operating frequency, transmit power level and spectral use strategy based on current environmental conditions; and a gateway radio that acts as a translator or go-between for multiple radios that communicate with it.

Also, before proceeding with a detailed description of the circuits and techniques used to provide high spectral resolution over large frequency bandwidths, some introductory concepts and terminology are explained.

As used herein, the term "radios" includes devices that communicate with other radios via wireless techniques (e.g. using radiated or near field electromagnetic energy).

As used herein, the term "frequency estimator" refers to a system which solves the general problem of estimating instantaneous frequencies present in a signal (as is known, at any instant in time, a signal can contain many frequency components).

Spectrum analyzers are frequency estimators that can, in addition to estimating the frequencies present in a signal, also determine amplitude, phase and/or power level characteristics of a signal. In other words, spectrum analyzers find the power spectral density of a signal. Spectrum analyzers thus form a subset of frequency estimators. Spectrum analyzers may also be viewed as a parallel, broadband generalization of narrowband radios that estimate amplitude or phase of a narrowband signal centered around a single carrier frequency.

Minimum and maximum input frequencies of interest to a spectrum analyzer are defined herein as $f_L$ and $f_H$, respectively. "Frequency bandwidth" or more simply, "bandwidth" B is computed as $B=f_H-f_L$. A bandwidth ratio $\beta$ characterizes the "frequency-domain dynamic range" required by the corresponding receiving system, where:

$\beta = f_H/f_L$ Equation (1)

In general, a spectrum analyzer is a device which separates an incoming signal spread over a bandwidth $B=f_H-f_L$ into N outputs ("bins") that each span smaller bandwidths which (ideally) don't overlap. The total power present in each bin is an approximation of the local power spectral density.

Referring now to FIGS. 1A-1F, in which like elements are provided having like reference designations throughout the several views, analogies between analog-to-digital converters (ADCs) and frequency estimator architectures used in accordance with at least one aspect of the present invention are shown. As shown in FIG. 1A, the basic operation of subtraction in the amplitude domain (voltage or current) used by ADCs may be accomplished using a subtractor circuit 10 which received two signals $V_1$, $V_2$ and provides an output signal corresponding the absolute value of the difference between the two signals e.g. $|V_1-V_2|$.

As shown in FIG. 1B, the basic operation of subtraction in the amplitude domain has a natural frequency-domain analog through mixing (super-heterodyning). Thus, in FIG. 1B, two signals $\omega_1+\omega_2$ are provided to a mixer 12 which produces sum and difference signals at an output thereof. However, if real signals are used in the frequency domain, only an unsigned subtraction (difference) can be obtained by mixing since positive and negative frequencies cannot be physically distinguished from each other. This case is shown in FIG. 1B, where a low-pass filter (LPF) 14 has a cut-off frequency $f_c$ selected to reject the sum frequency $\omega_1+\omega_2$ produced by the mixer, but passes the desired difference frequency component $|\omega_1-\omega_2|$.

A signed subtraction can be performed in the frequency domain if complex signals are used. Examples of complex multiplier structures 16, 18 are shown in FIGS. 1D and 1F, respectively. These complex multiplier structures 16, 18 use one or more 90 degree phase shifters 20 to perform side-band cancellation to reject unwanted frequency components and produce only the desired component, i.e., $\exp(j(\omega 1 - \omega 2)t)$ at the output.

Next described are several common ADC architectures and frequency estimators that are analogous to them. Some of these estimators are well-known, while others are novel. It should be noted that, unless mentioned otherwise, real signals are used throughout the following description. It should, however, be appreciated that one of ordinary skill in the art could extend any of the described frequency estimator and spectrum analyzer structures to the complex signal domain. For this purpose, the complex multipliers shown in FIGS. 1D and 1F can be used to replace the simple multiplier shown in FIG. 1B. Frequency estimators that use only real signals can be used to demodulate frequency-modulated waveforms. The use of complex signals allows phase-modulated waveforms to be demodulated as well.

One way to build a broad-band spectrum analyzer is to use multiple narrow-band frequency estimators that operate in parallel (simultaneously). This "filter bank" approach corresponds to the parallel or "flash" ADC. Flash converters are extremely fast (they convert in constant time, i.e, O(1)) but are extremely power-hungry. When the filters in the filter bank have finite roll-off slope, their frequency responses can overlap. As a result, a single input frequency will produce non-zero outputs from multiple filters at the same time. The amplitudes and phases of these outputs provide extra information that can be used to effectively improve the resolution of the frequency estimator. This approach corresponds to the "flash-interpolation" ADC structure.

Swept-sine (tunable super-heterodyne) spectrum analyzers mix the input frequency with a local oscillator (LO) whose frequency is ramped linearly with time. The power level present at the output of the mixer is estimated by a single super-heterodyne receiver. Different frequency components in the input reach the pass band of the output receiver at different times. Effectively, therefore, the architecture converts frequency to time; this corresponds to serial ADCs such as single-slope converters. However, in contrast to the ADC, the swept-sine architecture can produce multiple outputs (frequency estimates) in a single sweep.

Nevertheless, both structures use linear sweeps, which make them extremely slow over large dynamic ranges in signal amplitude (ADCs) or frequency (spectrum analyzers). An exponential or geometrically-scaled sweep synthesizes a wavelet-like transformation (a constant-Q structure) that is much faster in such situations. The biological cochlea is an example of a spectrum analyzer that has constant-Q characteristics. The analogous ADC structure is a single-slope converter implemented in the logarithmic signal domain.

Dual-slope ADCs are serial converters that use two sweeps (ramps), usually (but not necessarily) in voltage. An upward ramp with a slope proportional to the input signal is first performed for a fixed time $T_{ref}$. The voltage at the end of this ramp is $V\mathbf{0}+\alpha T\,X_{in}$ where $X_{in}$ is the input signal, $\alpha$ is a constant and $V\mathbf{0}$ is the initial voltage. This is followed by a downward ramp with fixed slope $\alpha X_{ref}$, where $X_{ref}$ is a constant. The time when the voltage reaches $V\mathbf{0}$ is given by $T=T_{ref}X_{in}/X_{ref}$. Thus $T \propto X_{in}$ as long as $T_{ref}$ and $X_{ref}$ are constant, thus converting time to voltage. The advantage of this technique over a single-slope is that T does not depend on the constant $\alpha$ (its effects are canceled out). Thus any uncertainties or nonlinearities in $\alpha$ don't affect the result of the conversion. The same principle can be used to build a dual-slope frequency estimator. In the first phase, the input frequency $\omega$ in is ramped up for a fixed time $T_{ref}$ with, for example, a frequency synthesizer. During the second phase a reference frequency $\omega_{ref}$ is ramped down in time by using a second, similar synthesizer. The time at which the two frequencies are equal encodes the value of the input frequency. Note that, unlike the single-slope swept-sine system, only a single frequency can be estimated per sweep with this technique.

Figure 2B:
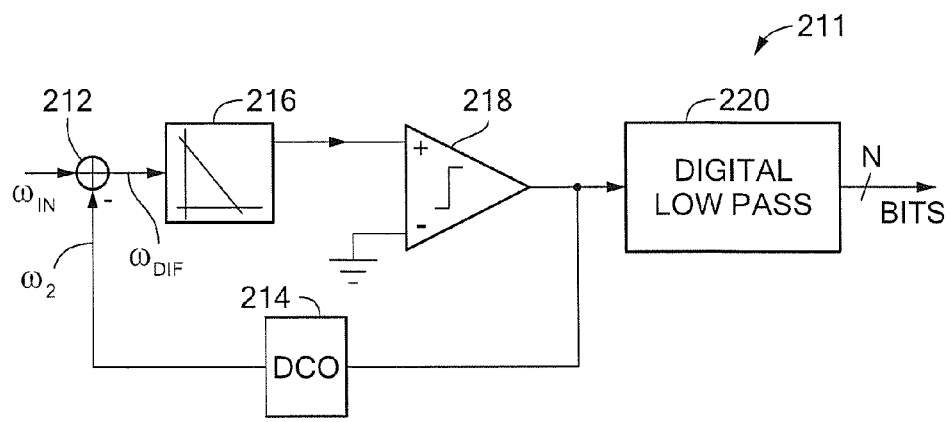
FIG. 2B illustrates a sigma-delta architectures for frequency estimation (i.e. FM to digital conversion.

FIGS. 2A and 2B illustrate analogous sigma-delta architectures for analog-to-digital converters (ADCs) and frequency estimators.

Referring first to FIG. 2A, a first order sigma-delta analog-to-digital (ADC) converter 201 includes a subtractor circuit 202 having a first port at which an analog input signal $V_{IN}$ to be converted to a digital signal is applied. A second port of the subtractor circuit 202 receives a second analog signal $V_2$ from the output of a digital-to-analog-converter (DAC) 204. The subtractor 202 calculates the instantaneous difference between the output of the DAC and the amplitude of the input signal $V_{IN}$ and provides an error signal $V_{ER}$ at a third port thereof. The error signal $V_{ER}$ is fed into an integrator circuit 206. The output of the integrator 206 is coupled to the positive terminal of a comparator 208. Comparator 208 has a negative terminal coupled to a reference voltage which in this example corresponds to ground. The comparator output drives the DAC 204 thereby completing a feedback loop. The output of the comparator 208 is a digital signal which can be low-pass filtered (decimated) in the digital domain via a digital filter 210 having a low pass filter characteristic to produce output bits.

As mentioned above, frequency-domain analogs of oversampled (sigma-delta) ADCs also exist and a sigma-delta frequency estimator circuit is described below in conjunction with FIG. 2B.

Referring now to FIG. 2B, a sigma-delta frequency estimator circuit 211 includes a subtractor circuit 212 having a first port at which an input signal $\omega_{IN}$ is applied. A second port of the subtractor circuit 212 receives a second signal $\omega_2$ from the output of a digitally-controlled-oscillator (DCO) 214. The subtractor 202 calculates the instantaneous frequency difference between the DCO signal $\omega_2$ and the input signal $\omega_{IN}$ and provides a difference frequency signal $\omega_{DIF}$ at a third port thereof. The difference frequency signal $\omega_{DIF}$ is provided to an integrator circuit 216. The output of the integrator 216 is coupled to the positive terminal of a comparator 218. Comparator 218 has a negative terminal coupled to a reference signal which in this example corresponds to ground. The output of the comparator 218 drives the DCO 214 thereby completing a feedback loop. The output of the comparator 218 is also coupled to a digital filter 220 having a low pass filter characteristic to thus produce output N output bits.

It should be noted that the DCO 214 in the frequency estimator circuit 211 of FIG. 2B replaces the DAC 204 in the frequency estimator circuit 201 of FIG. 2A. Otherwise, the structures of the ADC and the frequency estimator circuits 201, 211 shown in FIGS. 2A and 2B are substantially the same.

The subtractor 212 calculates the instantaneous difference between the output of the DCO 214 and the input frequency. This error signal is fed into the integrator 216. The output of the integrator 216 drives the comparator 218, which in turn drives the DCO 214, thereby completing the loop. The output of the comparator 218 is a digital signal which can be low-pass filtered (decimated) in the digital domain to produce the output bits. An exemplary implementation of the sigma-delta frequency estimator structure shown in FIG. 2B is described in conjunction with FIG. 3 below.

Figure 3:
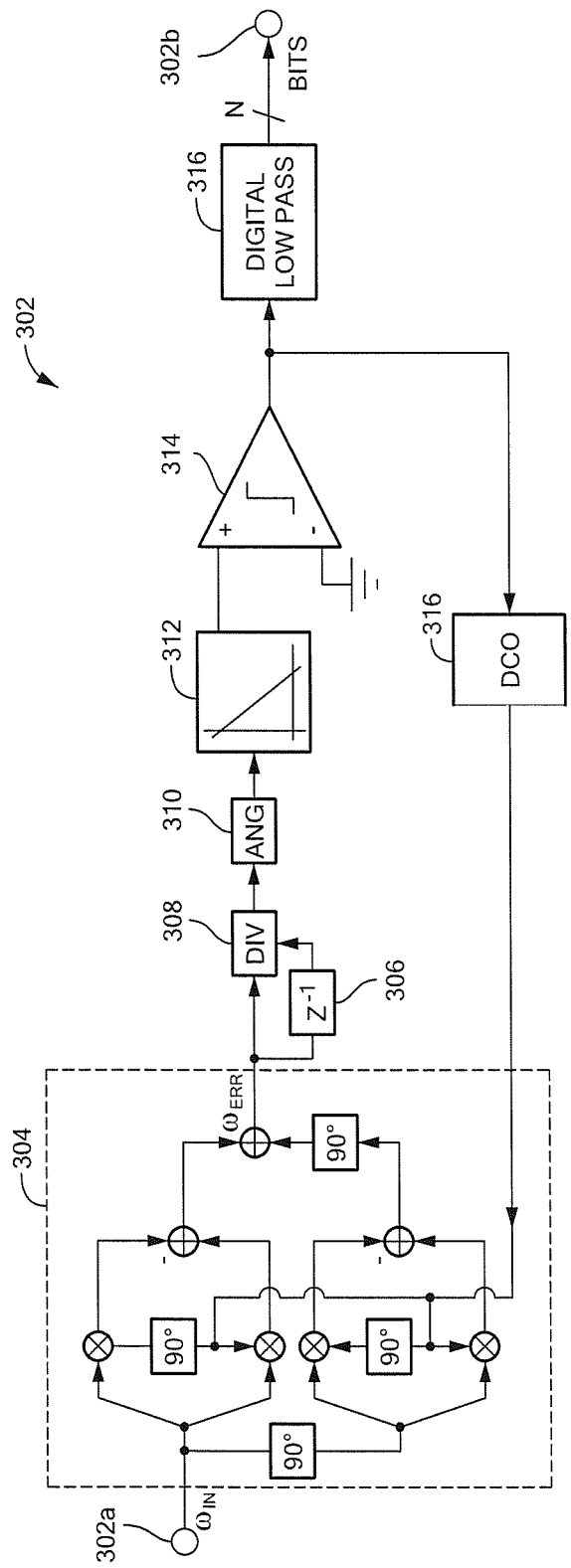
FIG. 3 is a block diagram of the sigma-delta frequency estimator architecture shown in FIG. 2B.

Referring now to FIG. 3, a sigma-delta frequency estimator 302 having an input port 302a and an output port 302b includes a complex multiplier circuit 304 which receives an input signal $\omega_{IN}$ and provides an output signal $\omega_{ERR}$ at an output port thereof. The complex multiplier circuit 304 operates as described above in conjunction with FIG. 1F and thus output signal $\omega_{ERR}$ corresponds to $\omega_{IN} - \omega_{DCO}$.

It should be appreciated that the sign of the frequency difference $\omega_{ERR}$ fed to the integrator (e.g. integrator 216) is important, so the simple multiplier and low-pass filter combination illustrated in FIG. 1B above cannot be used. Rather, a complex multiplier of the type described above in conjunction with FIG. 1D, for example, can be used which retains the sign of the frequency difference in the phase of the complex output signal $e^{(j(\omega/N\square - \omega DC0)t)}$. In order to avoid problems with phase wrapping, the phase of the ratio of this signal is found along with a version of itself delayed by a small constant time $\Delta T < 1/\square|\omega_{IN} - \omega_{DCO}|$. This operation is carried out by delay block 306, divider block 308 and 'ANG' block 310 in the figure FIG. 3. In some embodiments a continuous-time (analog) delay element can be used to replace the discrete-time delay element 306. The output from block 310 is a signal corresponding to $(\omega_{IN} - \omega_{DCO})\Delta T$, which is the error signal fed into an integrator 312.

The output of the integrator 312 is coupled to the positive terminal of a comparator 314. Comparator 314 has a negative terminal coupled to a reference signal which in this example corresponds to ground. The output of the comparator 314 is coupled to an output port 302b through a digital filter 316 having a low pass filter characteristic and is also coupled to an input of a DCO 316 thereby completing a feedback loop with the multiplier circuit 304.

Figure 4:
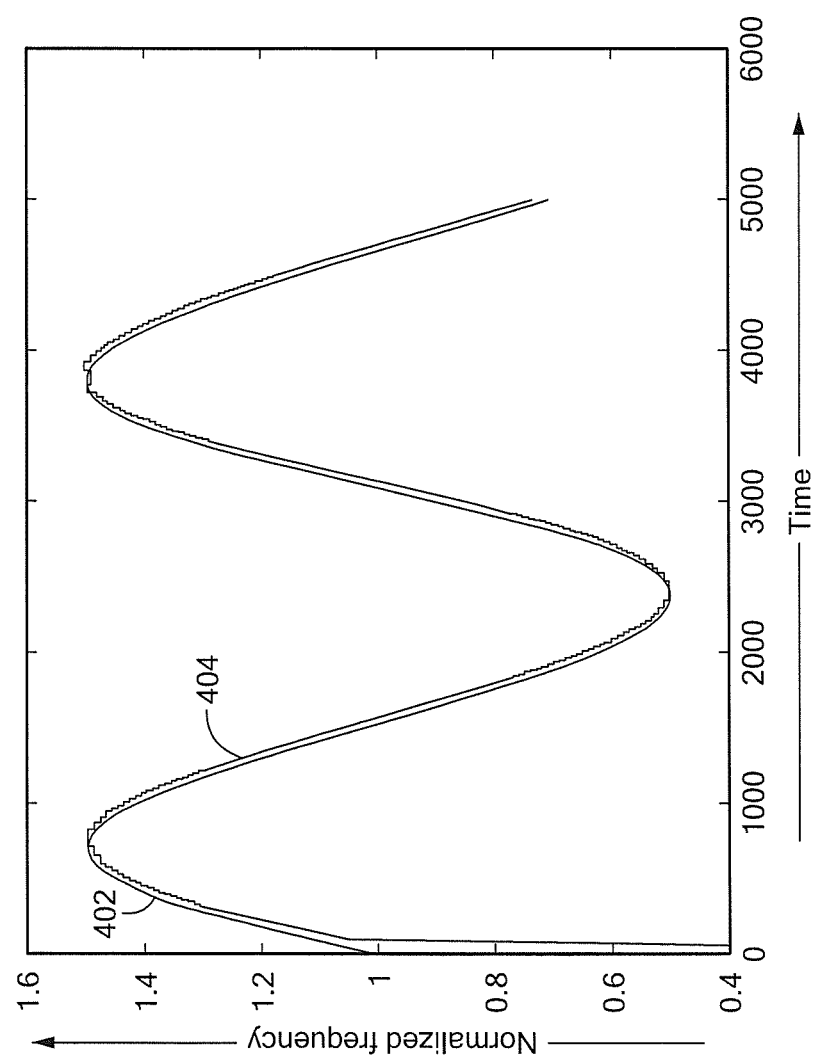
FIG. 4 is a plot of normalized frequency vs. time showing simulated results of the sigma-delta frequency estimator shown in FIG. 3.

Referring now to FIG. 4, a plot of normalized frequency vs. time is shown for simulation results from the sigma-delta frequency estimator of FIG. 3. An input signal frequency 402 was varied sinusoidally about a normalized frequency of 1 and the output of the comparator was low-pass filtered to produce the estimated output frequency designated by reference numeral 404. The two curves 402, 404 illustrate that the loop described above in conjunction with FIG. 3 faithfully tracks the input frequency (with a slight delay introduced by the output low-pass filter). The system acts as a direct frequency-to-digital converter and may prove useful for demodulating frequency modulated (FM) or frequency shift-keyed (FSK) waveforms in software-defined radio or other applications.

Next described is an analogy between successive-subranging and successive-approximation ADCs and frequency estimators.

Figure 5A:
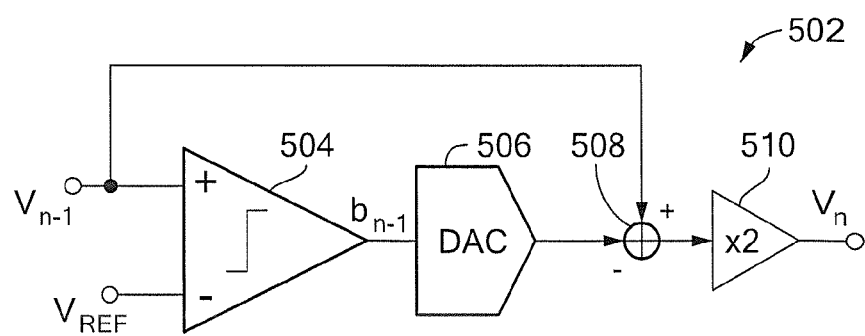
FIG. 5A is a block diagram of a single successive-subranging stage for an analog-to-digital converter.

Referring now to FIG. 5A, an n-th conversion stage 502 which maybe used in successive-subranging ADC algorithms produces one output bit and is cascaded successively in order to get more bits. The output of a previous conversion stage, $V_{n-1}$, is an analog signal, where $V_{REF}\square\square - V_{FS} < V_{n-1} < V_{REF} + V_{FS}$ and $V_{REF}$ and $V_{FS}$ are the reference and full-scale voltages, respectively. The output signal of the previous conversion stage $V_{n-1}$ is digitized by a comparator 504 to produce the next output bit $b_{n-1}$ where $b_{n-1} \in [-1, 1]$. This bit is converted into an analog signal by a one-bit digital-to-analog converter (DAC) 506 whose output voltages are $(V_{REF} + b_{n-} V_{FS})/2$. This signal is fed to a subtractor circuit 508 and subtracted from the original input signal $V_{n-1}$ to extract a residue signal which is fed to an amplifier circuit 510. In this exemplary embodiment, amplifier circuit 510 amplifies the signal by a factor of two to produce an output signal $V_n$, which may then be provided as an input to the next conversion stage.

Figure 5B:
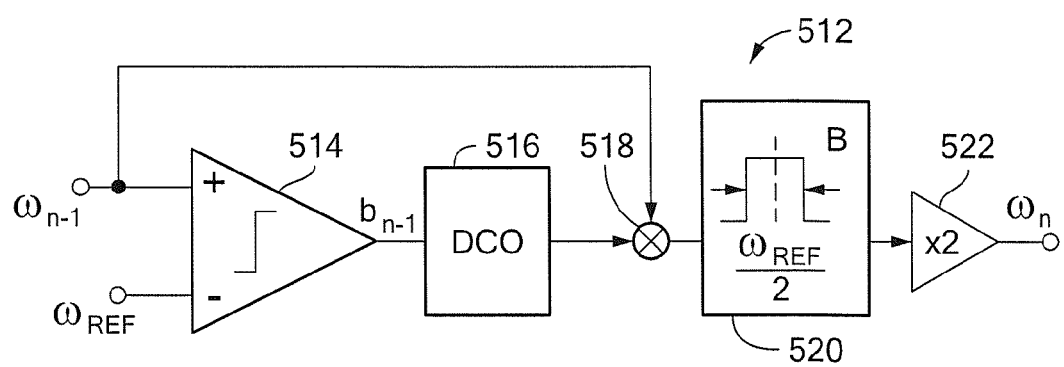
FIG. 5B is a block diagram of a single successive-subranging stage for a frequency-to-digital converter (i.e. a frequency estimator).

Referring now to FIG. 5B, a successive-subranging frequency estimation structure 512 is shown. It should be appreciated that frequency estimation structure 512 and conversion stage 502 described above in conjunction with FIG. 5A are analogous in that the two structures are functionally equivalent but operate in different signal domains: signal amplitude (voltage or current) and frequency, respectively.

A first signal $\omega_{n-1}$, is provided to a first input port of the frequency comparator 514 and a second signal $\omega_{REF}$ is provided to a second input of the frequency comparator 514. The first signal $\omega_{n-1}$ corresponds to an output of the previous conversion stage and the second signal $\omega_{REF}$ corresponds to a center frequency. The comparator 514 receives the two signals $\omega_{n-1}$ and $\omega_{REF}$ and produces an output bit $b_{n-1}$ which is provided to the input of a digitally controlled oscillator (DCO) 516.

In turn, the DCO 516 provides a signal to an input of a mixer circuit 518 which combines the DCO output signal with the original input signal $\omega_{n-1}$ to produce sum and difference frequency signals. The output of the mixer 518 is fed to a filter 520 having a bandpass filter characteristic. Filter 520 has a center frequency of $\omega_{REF}/2$ and a frequency bandwidth B. An appropriately filtered signal is coupled from the output of filter 520 to an input of an amplifier circuit 522. In this exemplary embodiment, amplifier circuit 522 amplifies the signal by a factor of two to produce an output signal $\omega_n$, which may then be provided as an input to the next conversion stage.

Thus, the reference and full-scale voltages discussed in conjunction with FIG. 5A are replaced by a center frequency $\omega_{REF}$ and bandwidth B. Therefore, $\omega_{REF}-B<\omega_{n-1}<\omega_{REF}+B$, where $\omega_{REF}>B$. The voltage comparator discussed in conjunction with FIG. 5A is replaced by the frequency comparator 514, the DAC by a digitally-controlled oscillator (DCO) that produces $\omega_{DCO}=(\omega_{REF}+b_{n-1}B)/2$ and the subtractor by a multiplier (mixer) followed by a bandpass filter (BPF). The condition $\omega_{REF}>B$ ensures that $\omega n-1 > \omega DCO$, i.e., the frequency difference is always positive and the multiplier and BPF together act as a linear subtractor in the frequency domain. It is interesting to note that, in contrast to the amplitude (ADC) domain, accurate multiplication and division by integer ratios is easy in the frequency domain. Well-known circuits for frequency division and multiplication can be used for this purpose. Harmonics and sub-harmonics of the signal itself may also be used.

Given the above description, generalizations of the structures shown in FIGS. 5A and 5B to multiple output bits (say $n_1>1$) per stage are within the skill of those of ordinary skill in the art. In this case, the comparator and DAC must be modified to produce and accept $n_1$ parallel bits, respectively. Also, the residue must be amplified by two at the end.

Successive-approximation and successive-subranging ADC structures are similar except for the absence of the residue-amplification (multiply-by-two) step in the former.

Figure 6A:
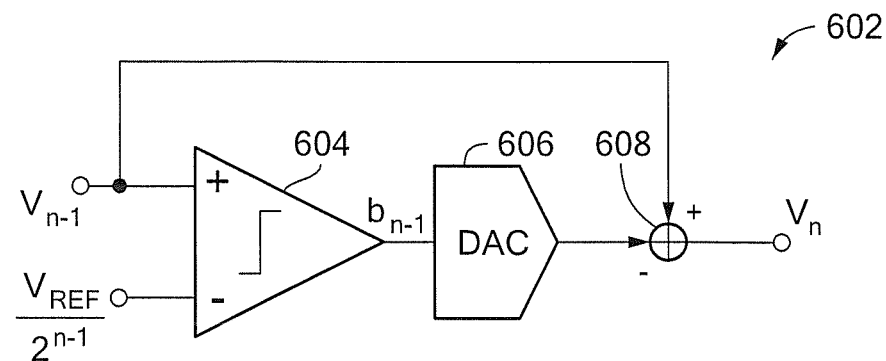
FIG. 6A is a block diagram of a single successive-approximation stage for an analog-to-digital converter.

Referring now to FIG. 6A, an n-th stage 602 of a successive-approximation ADC includes a comparator 604 having a pair of input ports which receive input signals $V_{n-1}$ and $V_{REF}/2^{N-1}$, respectively and provides an output bit $b_{n-1}$ at an output port thereof. The comparator output port is coupled to an input of a digital-to-analog converter (DAC) 606. The DAC receives the bit $b_{n-1}$ and in response thereto provides an analog output signal to a first input port of a subtractor circuit 608. A second input port of the subtractor circuit is coupled to the input signal $V_{n-1}$. An output signal $V_n$ is provided at an output port of the subtractor circuit 608.

It should be noted that successive-approximation ADC stage 602 is similar to the n-th conversion stage 502 described above in conjunction with FIG. 5A except for changed signal ranges and values. The input signal is $V_{REF}-V_{FS}<2_{n-1}V_{n-1}<V_{REF}+V_{FS}$. The comparator reference is $V_{REF}/2^{n-1}$ and the DAC output is $(V_{REF}+b_{n-1}V_{FS})/2^n$.

Figure 6B:
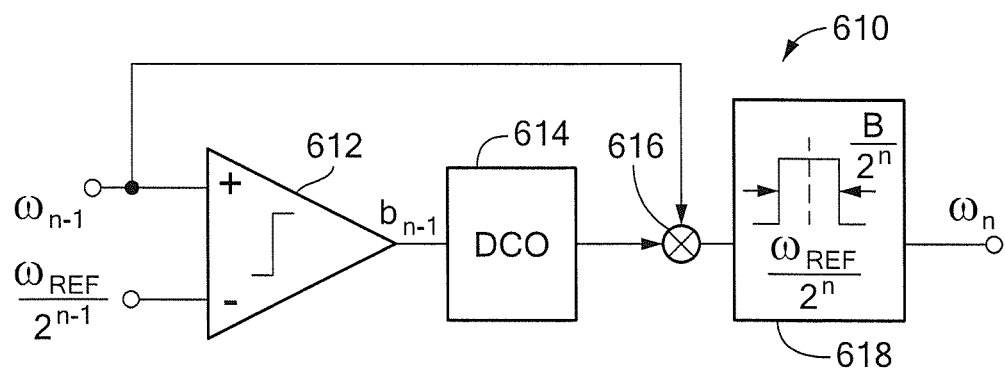
FIG. 6B is a block diagram of a single successive-approximation stage for a frequency-to-digital converter (i.e. a frequency estimator).

Referring now to FIG. 6B, a frequency estimator structure 610 includes a comparator 612 which receives two signals $\omega_{n-1}$ and $\omega_{REF}$ at respective input ports thereof. The comparator receives the input signals and produces an output bit $b_{n-1}$ which is provided to the input of a digitally controlled oscillator (DCO) 614.

In turn, the DCO 614 provides a signal to an input of a mixer circuit 616 which multiplies the DCO output signal with the original input signal $\omega_{n-1}$ to produce sum and difference frequency signals. The output of the mixer 616 is fed to a filter 618 having a bandpass filter characteristic. Filter 618 has a center frequency of $\omega_{REF}/2^n$ and a frequency bandwidth $B/2^n$. An appropriately filtered signal is coupled to an output of the frequency estimator structure 610.

It should be noted that in the embodiment of FIG. 6B, $\omega_{REF}$ and B replace $V_{REF}$ and $V_{FS}$ in FIG. 6A. Successive subranging is usually an advantage for ADCs because it reduces hardware performance requirements and noise contributions of later conversion stages and makes pipelining easier. For frequency estimators, eliminating residue-multiplication saves hardware and power (approximately a factor of two, assuming power is proportional to bandwidth) but increases analysis time since the later, lower-bandwidth stages take longer to settle. Although only successive-approximation frequency estimation algorithms are described in detail below, it should be appreciated that the generalization to successive-subranging architectures is within the level of skill for one of ordinary skill in the art.

An advantage of the successive-subranging and successive-approximation structures shown in FIGS. 5A-6B is that they can be pipelined to increase throughput.

Figure 7A:
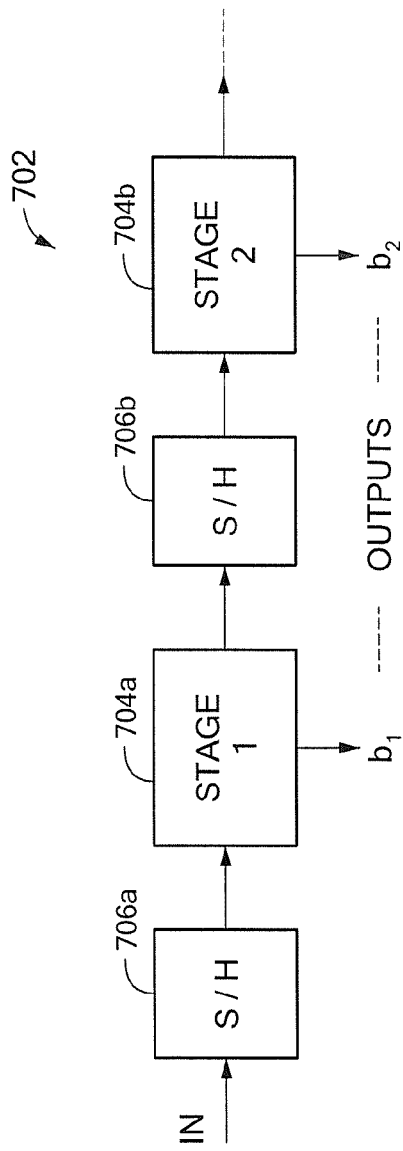
FIG. 7A is a block diagram illustrating the use of successive-subranging or successive-approximation stages for multi-bit analog-digital or frequency-digital conversion by using a pipelining technique.

Referring now to FIG. 7A, pipelined circuit 702 includes a plurality of stages 704a, 704b cascaded to perform a multi-bit conversion. Pipelining is enabled simply by adding sample-and-hold circuits 706a, 706b between the stages. Adding a sample-and-hold circuit between stages 706a, 706b also allows a single stage to be used for multi-bit conversions by using feedback.

Figure 7B:
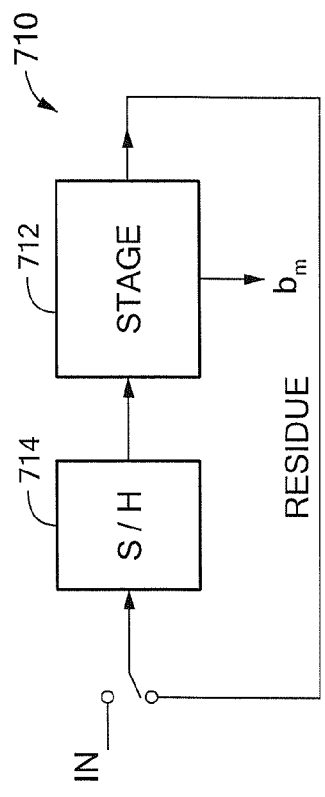
FIG. 7B is a block diagram illustrating the use of successive-subranging or successive-approximation stages for multi-bit analog-digital or frequency-digital conversion by using a cyclic or algorithmic architecture.

Referring now to FIG. 7B, a cyclic or algorithmic ADC architecture 710 is shown. In this architecture, a single approximation or subranging stage 712 is used with a sample and hold circuit 714 inside a feedback loop. The conversion proceeds in M steps, where M is the total number of output bits. The approximation or subranging stage produces a single bit and residue in one time step. This residue is then fed back into the same stage during the next time step to produce the next bit. The key feature of algorithmic converters is hardware reuse, which reduces throughput by preventing pipelining but eliminates mismatches between stages. It should be appreciated that successive-approximation stages (unlike successive-subranging stages) need to be "re-tuned" at every time step during a algorithmic conversion. This is because the comparator reference and BPF bandwidth during the m-th time step are both proportional to $2^{-m}$. Successive-subranging stages keep these quantities constant because they multiply the residue by two at the end. Pipelined and algorithmic approaches can be extended to frequency estimation in a straightforward way. The same basic subranging and approximation stages shown in FIG. 5A-6B can be used. An injection-locked oscillator or phase-locked loop (PLL) can be used as the frequency-domain analog of a sample-and-hold.

Figure 8:
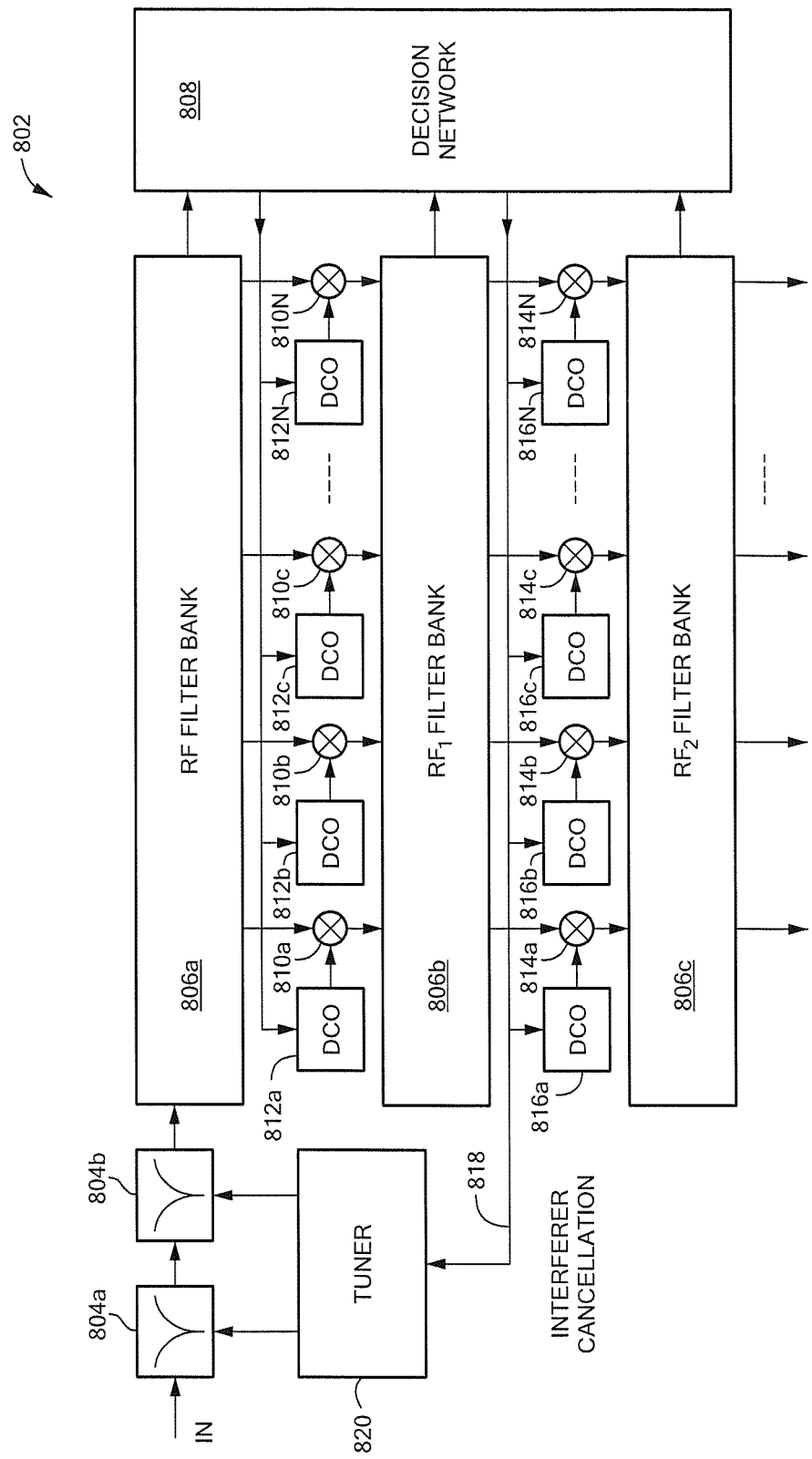
FIG. 8 is a block diagram of a successive-approximation architecture for fast, hierarchical frequency estimation of multiple narrowband signals.

Referring now to FIG. 8, a broad-band radio architecture 802, includes a plurality of tunable filters 804a, 804b which lead to a first RF filter bank 806a. In one particular application to be described below the filters 804a, 804b are provided having a notch filter characteristic. The filter bank 806a includes N filters. The filter bank 806a provides an appropriately filtered signal to a decision network 808 and also provides N filtered signals with each of the N filtered signals coupled to a corresponding one of N mixer circuits 810a-810N.

Each of the mixer circuits 810a-810N has a second input port coupled to a corresponding one of N DCOs 812a-812N. The DCOs are each coupled to the decision network 808 and each receive an input signal from the decision network 808. Each of the mixer circuits 810a-810N provides an intermediate frequency (IF) signal to a filter bank 806b.

The filter bank 806b also includes N filters and provides an appropriately filtered signal to the decision network 808 and also provides N filtered signals to corresponding ones of N mixer circuits 814a-814N. The mixer circuits receive a second input signal from DCOs 816a-816N. The decision network 808 provides a signal to the DCOs 816a-816N via signal path 818 and also provides a signal to a tuner 820.

The tuner 820 uses the signal from the decision network 808 to tune the filters 804a, 804b. The filters 804a, 804b allow undesirable signals to be filtered out. In one application, for example, the filters 804a, 804b are provided having a notch filter characteristic and are used in a cancellation strategy in which the cascaded super-heterodyne structure accurately estimate the frequencies and bandwidths of unwanted signals proximate in frequency to a desired signal. The tuner 820 tunes the notch filters 804a, 804b to filter out or cancel the unwanted signals. The unwanted signals may have signal strengths, which are stronger than the signal strength of any desired signal(s). Thus, the unwanted signals are sometimes referred to as "interfering signals" or more simply "interferers." By canceling out the interferers using the tunable filters 804a, 804b at the input of the cascaded super-heterodyne structure, the system is able to detect desired signals having a signal strength which is relatively weak compared with the signal strength of unwanted signals which exist within the bandwidth of the system. Thus, the broadband radio embodiment of FIG. 8 includes an interference cancellation strategy.

It should be understood that while two filers 804a, 804b are shown, those of ordinary skill in the art will appreciate that fewer than two (including zero filters) or more than two filters can be used and the particular number of filters to use can be selected in accordance with the particular application. Also, the filters 804a, 804b may be provided having any filter characteristics appropriate for a particular application includes the above described notch filter characteristic.

In this exemplary embodiment, three filter banks 806a, 806b 806c are shown. Those of ordinary skill in the art will appreciate, however, that any number of filter banks (e.g. M filter banks) can be used.

The radio architecture of FIG. 8 uses successive approximation to perform hierarchical, parallel estimation of multiple frequencies. The logic behind this architecture is that, over large bandwidths, the real radio spectrum is extremely sparse. It is dominated by a limited number of relatively narrow-band signals which cumulatively occupy only a small fraction of the total bandwidth. Some of these signals are of interest to the user, while others are not, and are referred to as interferers. In practical situations the signal strength of these interfering signals can be much larger than the signal strength of the signal of interest. A system that observes several relatively narrow-band signals (placed arbitrarily in frequency space) in parallel would therefore be able to monitor essentially all signals of interest in an extremely large radio bandwidth. The architecture of FIG. 8 efficiently solves the problem of estimating where these observed regions of the spectrum should be placed.

One advantage of the cascaded super-heterodyne architecture shown in FIG. 8 is that it allows monitoring of N signals of interest in parallel with high temporal resolution and any desired spectral resolution. Here N is the number of filters in each filter bank. The architecture is also efficient in terms of hardware requirements because it only needs M filter banks and M□×N mixers to increase spectral resolution by a factor of $\alpha^M$. The outputs of each filter bank are bandpass signals with center frequencies that scale arbitrarily with position (linear or exponential scalings are common). The bandwidth of these signals is successively reduced by the mixers and succeeding filter bank. The output of the m-th filter bank has a bandwidth $B_m$. When bandwidth is reduced by a constant factor $\alpha$ at each step, $B_m$ decreases exponentially with m, i.e., $$B_m = B_{m-1}/\alpha = B_0/\alpha_m \quad \text{Equation (2)}$$

A common value for $\alpha$ is two, which corresponds to the canonical situation shown in FIG. 6B. As in that figure, the decision network in FIG. 8 comprises of frequency comparators and oscillators that determine which part of the input bandwidth $B_{m-1}$ should be included in the output bandwidth $B_m$. Frequency comparators can be built in several ways. For example, the total energy present on either side of the center frequency $\omega_{REF}$ can be integrated and the two results compared. The result of the comparison is a decision on whether the frequency being estimated is higher or lower than $\omega_{REF}$.

Thus, the output of each successive filter bank allows the user to examine signals of interest in greater and greater detail. In addition, the outputs of the decision network are digital signals that are the results of N parallel frequency-to-digital conversions (analogous to analog-to-digital conversions). It should also be noted that the structure retains amplitude information about each output signal and thus acts as a spectrum analyzer as well as a frequency estimator. The circuit allows the frequencies of any interfering tones to be rapidly estimated to any degree of precision and then canceled out using the tunable filters (e.g. tunable notch filters 804a, 804b).

Figure 9:
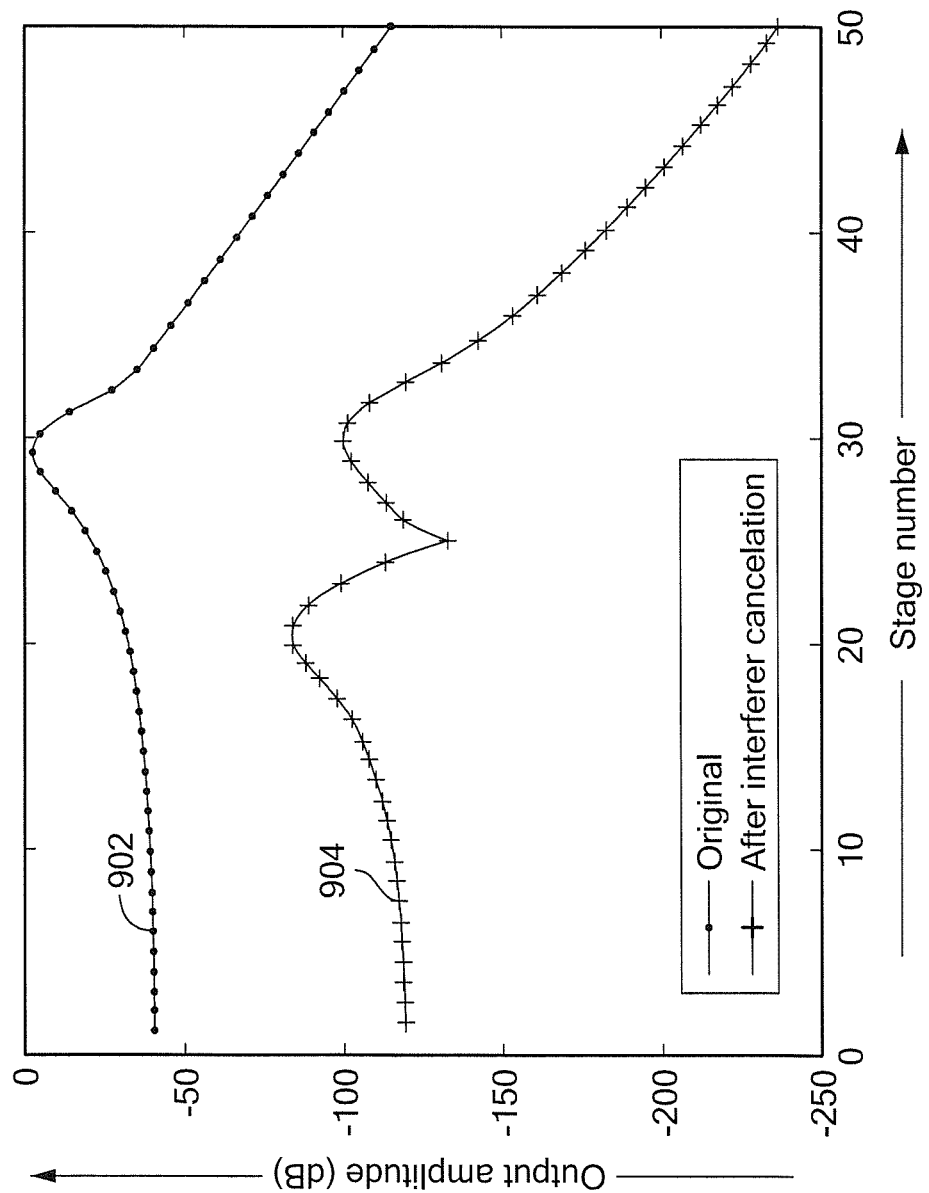
FIG. 9 is a plot of output amplitude vs. stage number for a simulated cascaded super-heterodyne architecture of the type shown in FIG. 8 which shows outputs of the final filter bank in the presence of a large interfering signal.

Referring now to FIG. 9, simulated results of the operation of a system having a cascaded super-heterodyne architecture of the type which is the same as or similar to that shown in FIG. 8 are shown. Two tones one octave apart are fed into the system of FIG. 8. One signal is 80 dB larger in amplitude than the other. Curve 902 labeled "original" shows the results without interferer cancellation. It can be seen that the smaller tone is invisible in curve 902. Curve 904 labeled "after interferer cancellation" shows the output of the final filter bank after the large interfering tone has been estimated and notched out. As can be seen, the signal tone having the lower amplitude is now clearly resolved. Thus, the outputs of the final filter bank in the presence of a large interfering signal are more readily discernable. The interferer, which was 80 dB larger and an octave in frequency below the signal of interest, was canceled out by using the technique described herein.

Finally, the cascaded super-heterodyne structure shown in FIG. 8 can be easily modified to use successive-subranging instead of successive-approximation. For this purpose, frequency multipliers must be added at each filter bank output. Successive filter banks are then identical to each other (i.e., their frequency range and bandwidth remain constant, instead of decreasing by $\alpha$ every time). In fact, only a single filter bank can now be used, with the output residues being fed back in the manner similar to the cyclic or algorithmic structure shown in FIG. 7B.

As used herein an "RF cochlea" is a system that performs fast, broadband, low-power RF spectrum analysis by using exponentially-tapered bidirectional transmission lines or unidirectional filter cascades. The transmission lines can be continuous or discrete/lumped, and by "exponentially-tapered" it is meant that the characteristic frequency of the structure scales exponentially with position.

Previously known, conventional hardware implementations of RF cochlea-like architectures have used analog very large scale integrated (VLSI) circuits at audio frequencies, micro-fabricated hydromechanical structures and discrete passive components at in the very high frequency (VHF) range of about 20 MHz to about 70 MHz. In one prior art system, a completely passive bidirectional (transmission-line) model of the biological cochlea was implemented. The structure is then used for performing signal separation based upon frequency content (i.e., spectral analysis). Elements of cochlear operation have also inspired techniques for signal-enhancement and synthesizing RF filters. Prior art cochlea systems that operate at RF and that use active devices (such as transistors) as integral parts of the structure have also been described as have circuits that can be used to build an RF cochlea.

It has, however, been discovered that exponentially tapered traveling-wave structures like the cochlea are faster and more hardware-efficient than other spectral analysis techniques when the fractional bandwidth $\beta$ is large. Intuitively, this is because the outputs of the cochlea have bandwidths that scale with center frequency. High-frequency stages have proportionally more bandwidth than low-frequency ones, reducing the total number of stages required to cover large frequency ranges than if the bandwidths had been kept constant. This type of behavior is known as a constant-Q response, and is also displayed by wavelet transforms. Here Q is defined as the bandwidth of each frequency bin normalized by the center frequency, i.e., $$Q_n = (f_{n+1} - f_{n-1})/2 f_n \approx df_n/(f_n d_n) = d \ln(f_n)/d_n \quad \text{Equation (3)}$$

Where:
$Q_n$ is the Q of the n-th bin; and
$f_n$ is the center frequency of the n-th bin.

In order to keep $Q_n$ constant, $\ln(f_n)$ must be proportional to n, i.e., $f_n \propto \exp(kn)$, where k is a constant. Thus constant-Q responses occur when the center frequencies of spectral analysis bins scale exponentially with position.

The performance of various commonly used spectrum analysis algorithms is compared in Table II, where N is the number of outputs (frequency bins) obtained within the acquisition time, $\beta = f_H/f_L$ is the bandwidth ratio and $B = f_H - f_L$ is the total bandwidth. The hardware complexity of each algorithm is measured by the number of elementary computational units it consumes. A second-order analog filter is considered the elementary unit for the analog algorithms, while additions and multiplications fulfill a similar role for a fast Fourier Transform (FFT). It can immediately be seen that the constant-Q (exponentially-spaced) algorithms have lower acquisition time and hardware complexity than similar constant-bandwidth algorithms (i.e., $(f_n - f_{n-1})$=constant) when $\beta$ is large. Only the cochlea, however, combines low acquisition time with low hardware complexity.

The cochlea comprises N stages, each producing one of the spectrally-analyzed, constant Q outputs. It is very efficient in its use of hardware because it uses a traveling-wave architecture. In traveling-wave structures, the output signal from each stage is filtered by several other, nearby stages, which are simultaneously also producing their own outputs. In other words, the frequency selectivity of several stages is reused while synthesizing output transfer functions. This co-operative action stands in contrast to all the other algorithms listed in Table II below.

TABLE II

COMPARING VARIOUS SPECTRUM ANALYSIS ALGORITHMS

| Name | Acquisition time | Hardware complexity |
| --- | --- | --- |
| Swept-sine (linear sweep) | $O(N^2/B)$ | $O(N)$ |
| Swept-sine (exponential sweep) | $O(1/f_L(N/\ln\beta)^2)$ | $O(N/\ln\beta)$ |
| Analog filter bank (linear spacing) | $O(N/B)$ | $O(N^2)$ |
| Analog filter bank (exponential spacing) | $O(1/f_L(N/\ln\beta))$ | $O(N^2/\ln\beta)$ |
| FFT | $O(N/B)$ | $O(N \log(N))$ |
| Cochlea | $O(1/f_L(N/\ln\beta))$ | $O(N)$ |

In these other algorithms, each of the N stages producing outputs are functionally independent of each other. By filtering collaboratively, the cochlea reduces the filter order and complexity required by each of its stages. However, the overall cochlear transfer functions resemble high-order filter responses since they combine the filtering action of several adjacent cochlear stages. They thus exhibit high roll-off slopes and frequency selectivity. In summary, the use of collective computation enables the cochlea to reduce hardware complexity and power consumption without sacrificing performance. This is the reason why the cochlea is not well-represented as a bank of constant-Q bandpass filters that analyze the input in parallel. In fact, as shown in Table II, the cochlea has an acquisition time that is similar to exponentially-spaced banks of analog filters, i.e., $O(N/(fL \ln \beta))$. However, its hardware complexity is low ($O(N)$) and similar to that of swept-sine spectrum analyzers.

Figure 10:
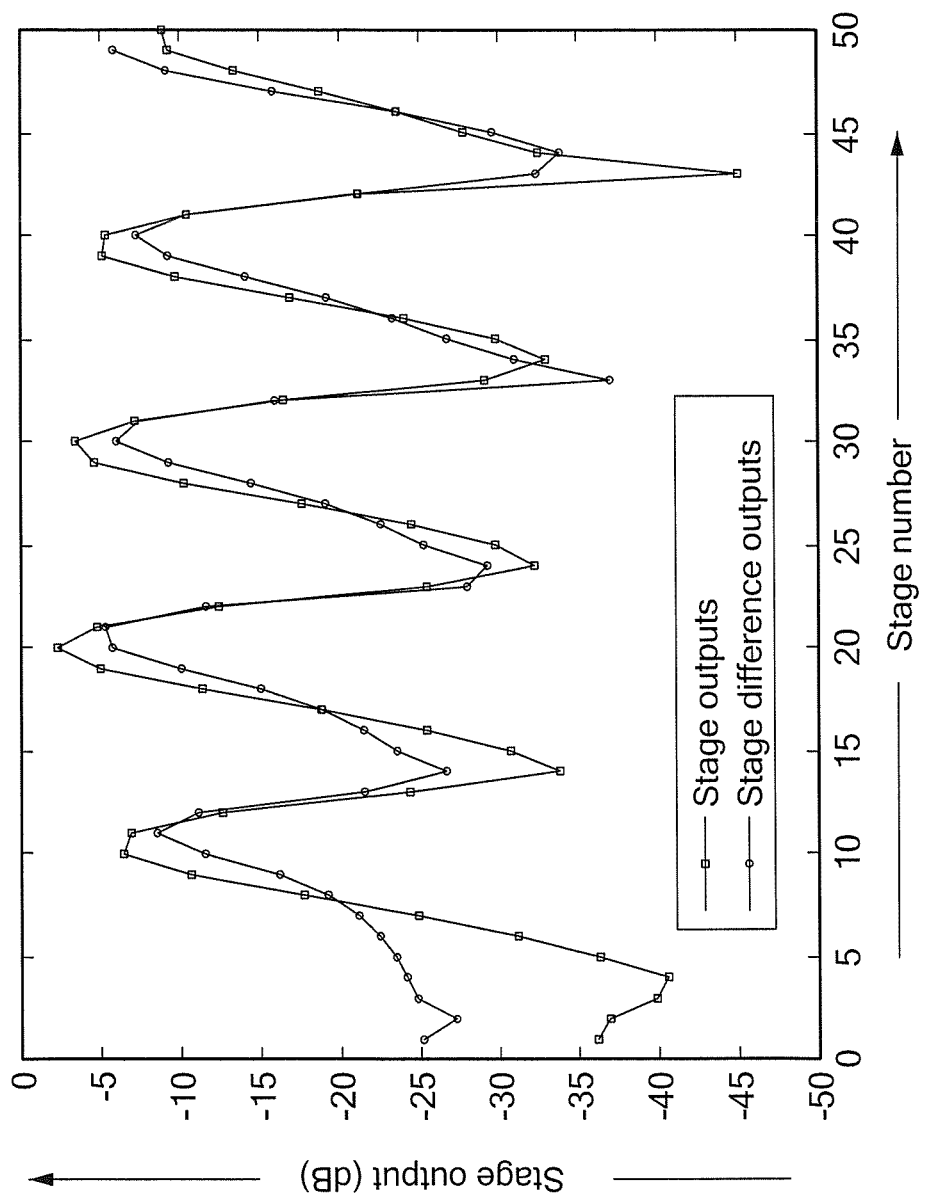
FIG. 10 is a plot of simulated outputs (spatial response) of a unidirectional RF cochlea to multiple equal-amplitude input tones spaced one octave apart.

Referring now to FIG. 10, a "spatial response" plot shows simulated outputs of each stage of an RF cochlea in response to an input signal consisting of multiple tones spaced one octave apart. Each peak in this spatial response plot corresponds to a single tone, illustrating how the cochlea performs spectral analysis. An added advantage of using constant-Q frequency separation bandwidths is that they are better matched to the real RF environment.

As is known, the RF spectrum is divided into licensed and unlicensed bands that roughly follow constant-Q characteristics. Bands at higher frequencies are wider than at lower frequencies. For example, the Q of the unlicensed industrial-scientific-military (ISM) frequency bands allocated by the FCC in the United States only vary by about a factor of ten as the center frequencies vary by over five orders of magnitude.

Figure 11:
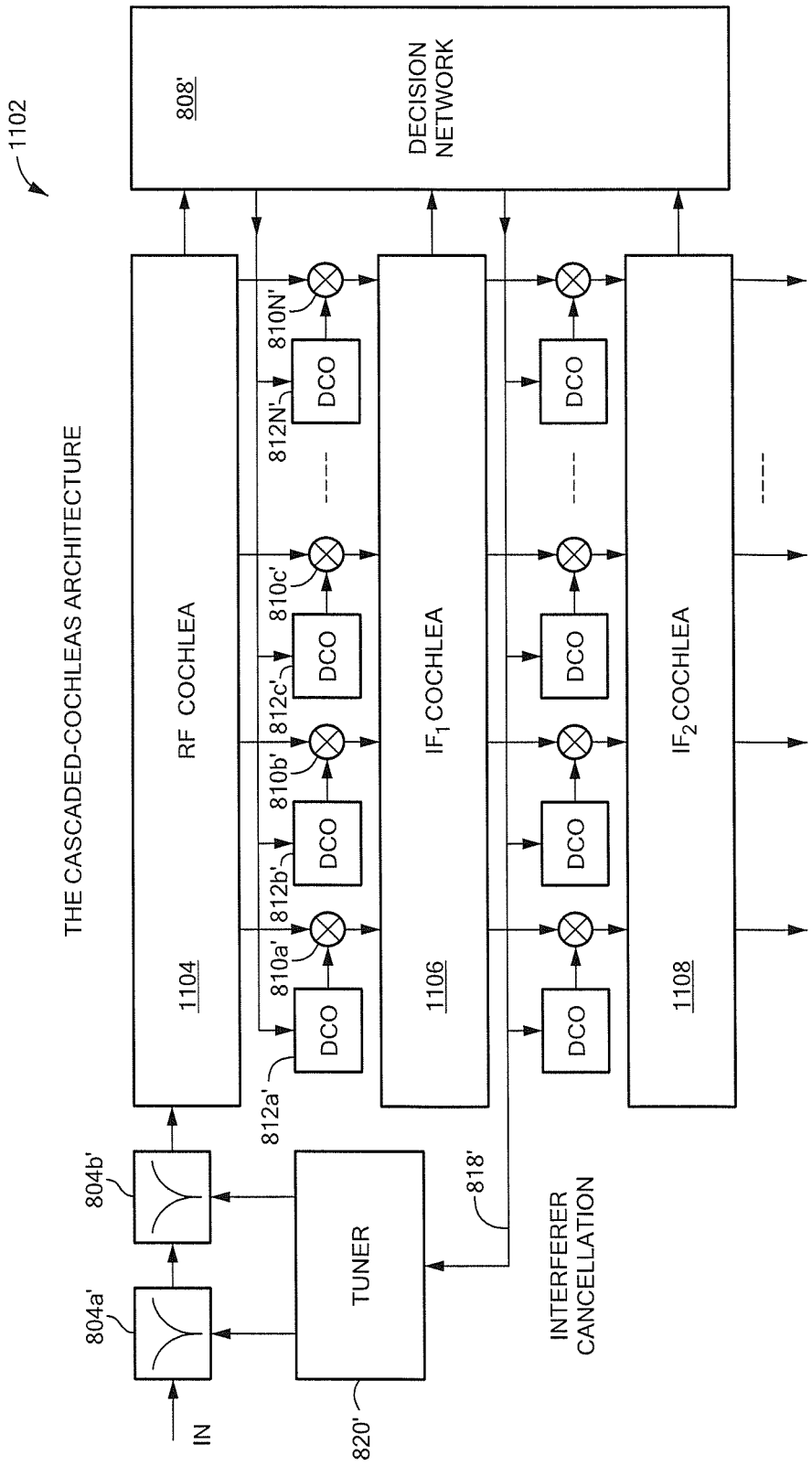
FIG. 11 is block diagram of a successive-approximation architecture for hierarchically analyzing spectra to any level of precision by cascading cochlea-like structures at each level of the analysis.

The RF cochlea is ideally suited for use as a front-end in an ultra-wideband radio receiver because of its extremely rapid frequency scan rate. Possible applications for such a receiver include cognitive radio. For example, the filter banks in FIG. 8 can be replaced by cochleas. When this substitution is made in the cascaded super-heterodyne architecture of FIG. 8, the resulting structure is referred to herein as the cascaded cochleas architecture. One example of a cascaded cochleas architecture is shown in FIG. 11. In this structure, frequency estimation is performed hierarchically by cochlear models operating in different frequency ranges (for example, RF, IF and baseband), thus allowing multiple frequency bands to be monitored in parallel at any desired level of resolution. This structure is analogous to a successive-approximation ADC with many parallel outputs and provides a scalable, efficient way to implement flexible, broadband, "universal" radio receivers.

Referring now to FIG. 11, a cascaded cochleas structure 1102 includes one or more tunable filters 804a', 804b', a decision network 808', mixer circuits 810a'-810N', 814a-814N, DCOs 812a'-812N', 816a-816N and a tuner 820' all of which may be the same as or similar to the like elements described above in conjunction with FIG. 8. The cascaded cochleas structure also includes one or more RF cochlea circuits 1104a-1104c.

The first RF cochlea circuit 1104a receives an input signal the filters 804a, 804b' and provides a signal to the decision network 808'. Each of the mixer circuits 810a'-810N' receives input signals from RF cochlea 1104a and from respective ones of the DCOs 812a'-812N' and provides an intermediate frequency (IF) signal to second cochlea bank 1104b. The DCOs 812a'-812N' are coupled to the decision network 808' and receive an input signal from the decision network 808'. Each of the mixer circuits 810a'-810N' provides an intermediate frequency (IF) signal to a second cochlea bank 1106. The cochlea bank 1106 also a signal to the decision network 808' and also provides N signals to corresponding ones of N mixer circuits 814a'-814N'. Each of the mixer circuits 814a'-814N' receives a second input signal from DCOs 816a'-816N'. The decision network 808' provides a signal to the DCOs 816a'-816N' via signal path 818' and also provides a signal to a tuner 820' which tunes the one of more filter 804a', 804b'.

The cascaded cochleas structure uses an adaptive successive-approximation approach to efficiently estimate sparse spectra. A typical value of the bandwidth-reduction factor between successive cochleas is α=2. Each cochlea 1104, 1106, 1108 has one-half of the bandwidth of the previous one but is otherwise identical, thus providing double the frequency resolution. The outputs of the previous cochlea are fed into it in parallel after being downconverted using mixers. Each downconversion step selects half of the output bandwidth of the previous cochlear tap. As in the structure of FIG. 8, the decision network 808' controls which half gets selected by changing the LO frequency $f_{ij}$ of the mixer between $f_{ij,0}$ and $f_{ij,1}$ where i>0 is the cochlea index and 1<j<N is the tap index.

A simple but effective decision rule is to use whichever value of $f_{ij}$ gives the higher output amplitude at the same tap location on the next cochlea, i.e., at position (i+1, j). This algorithm results in the structure adaptively "locking in" on features of interest in the spectrum at any level of frequency resolution. Once the algorithm has converged, the bits at any tap location j contain information about frequencies present in the input. In fact, the whole process is a massively parallel, successively-approximating frequency-to-digital conversion, with the outputs of the first cochlea 1104 providing the MSBs, those of the second cochlea 1106 the next-most-significant bits and so on. It should also be noted that the structure retains amplitude information about each output signal and thus acts as a spectrum analyzer as well as a frequency estimator.

The total acquisition time of the cascaded cochleas structure is dominated by the final cochlea since it analyzes the lowest input frequencies. The structure scales as:

$$O(N/f_{L,M})$$

in which:

$f_{L,M} = f_{L0}/\alpha^M$ is the lowest frequency analyzed by the final cochlea;

M is the total number of cochleas; and $f_{L0}$ is the lowest frequency analyzed by the first (input) cochlea.

The hardware complexity of the cascaded cochlea structure is modest: it scales as O(N log(M)).

Figure 12A:
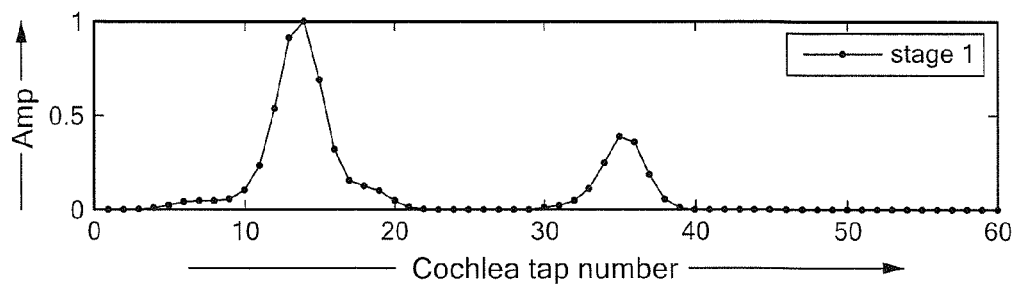
FIGS. 12A-12C are a series of plots of simulated outputs (spatial response) of normalized output amplitude vs. cochlea tap number for a cascaded cochleas structure to an input consisting of five sinusoids with different frequencies and amplitudes with outputs after one, three and five cochleas are shown in FIGS. 12a-12C, respectively.
Figure 12B:
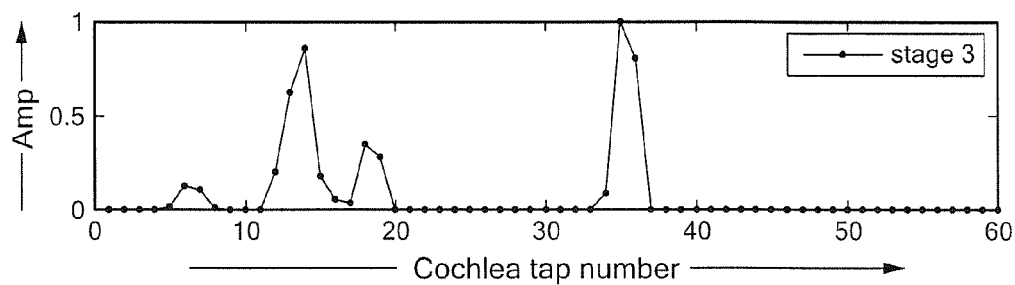
Figure 12C:
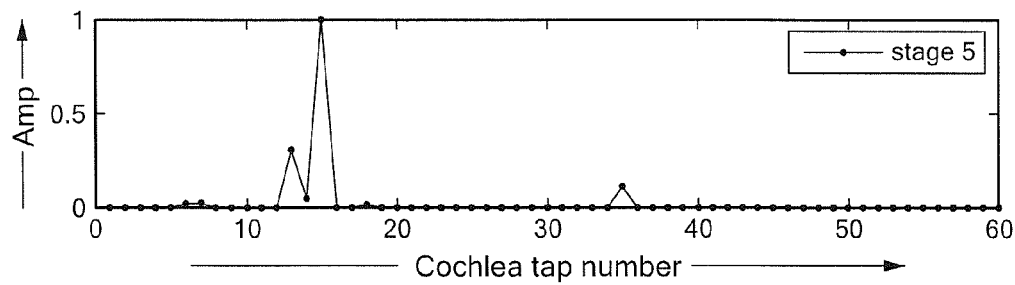

Referring now to FIGS. 12A-12C, simulated outputs produced by the cascaded cochleas structure of FIG. 11 at different levels of spectral resolution are shown. The input contained five sinusoids with different frequencies and amplitudes. Resulting spatial responses are shown for i=1, 3 and 5. As expected, each successive cochlea ("stage") increases spectral resolution. For example, a comparison of FIGS. 12A and 12C show how two inputs that were too close to each other in frequency to be resolved after the first stage (FIG. 12A) are clearly separated after the fifth stage (FIG. 12C).

Finally, it should be appreciated that one of ordinary skill in the art can modify the cascaded-cochleas structure shown in FIG. 11 to use successive-subranging instead of successive-approximation. For this purpose, frequency multipliers must be added at each cochlear output. Successive cochleas are then identical to each other (i.e., their frequency range and bandwidth remain constant, instead of decreasing by α every time). In fact, only a single cochlea can now be used, with the output residues being fed back in the manner similar to the cyclic or algorithmic structure shown in FIG. 7B. The total acquisition time of this successive-subranging cascaded cochleas structure scales as $O(NM/f_{L,0})$; it is thus $\alpha^M/M$ times faster than the successive-approximation version and has similar or lower hardware complexity.

Implementations of the RF cochlea are next described.

An RF cochlea can be conventionally implemented using active, nonlinear transmission lines (continuous or lumped) or filter cascades with properties that scale exponentially with position. Important nonlinear aspects of cochlear operation include spectral masking, enhancement and automatic gain control.

In accordance with an aspect of the present invention, simplified one-dimensional bidirectional and unidirectional cochlear structures have been developed. These structures are discrete approximations of (continuous) differential equations that can be implemented in hardware with a finite number of components.

Figure 13A:
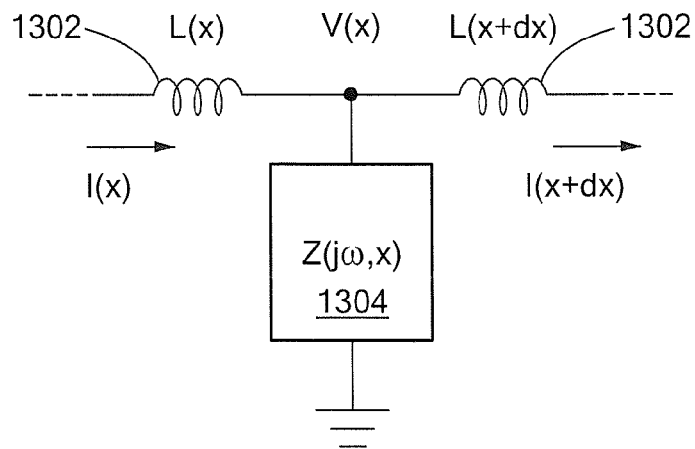
FIG. 13A is a block diagram of a simplified one-dimensional RF cochlea s, (a) bidirectional structure.
Figure 13B:
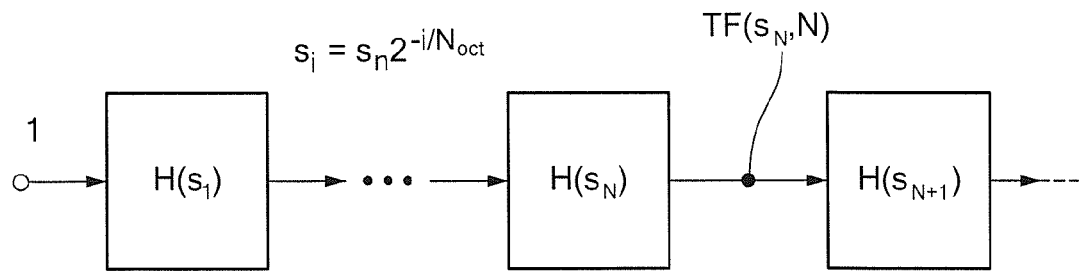
FIG. 13B is a block diagram of a simplified one-dimensional RF cochlea for a unidirectional structure.

Referring now to FIG. 13A a bidirectional structure comprises a lumped transmission line that resonates at frequencies decreasing exponentially with position. Similarly, a unidirectional structure, shown in FIG. 13B comprises a cascade of unidirectional resonant low-pass filters with exponentially decreasing cutoff frequencies. Both bidirectional and unidirectional cochlear structure can be used in the cascaded cochleas structure shown in FIG. 8.

The bidirectional structure shown in FIG. 13A uses series inductors 1302 having an inductance L(x) that increase exponentially in value from the beginning (high frequency end) to the end (low frequency end). The normalized impedance of the series inductors is given by $Z_s = \gamma s$, where γ is a positive constant, s=jωexp (x/l) is a normalized frequency variable and/is a constant. An shunt element 1304 having a shunt impedance Z(jω,x) and frequency responses and characteristic frequencies that also scale exponentially with position x is coupled in shunt between the inductance elements. It was discovered that useful spectral analysis cannot be performed by this structure unless Z(jω,x) is active (i.e., not realizable using passive components alone). The simplest rational form for Z(jω,x) is given by:

$$sZ(s) = (s^2 + 2ds + 1)^2 / (s^2 + s(\mu/Q) + \mu^2) \quad \text{Equation (4)}$$

where d, μ and Q are positive constants.

It has been discovered that an impedance-admittance transformation on the structure shown in FIG. 13A can be performed. The basis of this transformation is exchanging the roles of voltage V and current I in the differential equations used to describe the circuit. As a result, admittances become impedances, series elements become shunt elements (and vice versa) but transfer functions remain functionally unchanged.

Figure 14A:
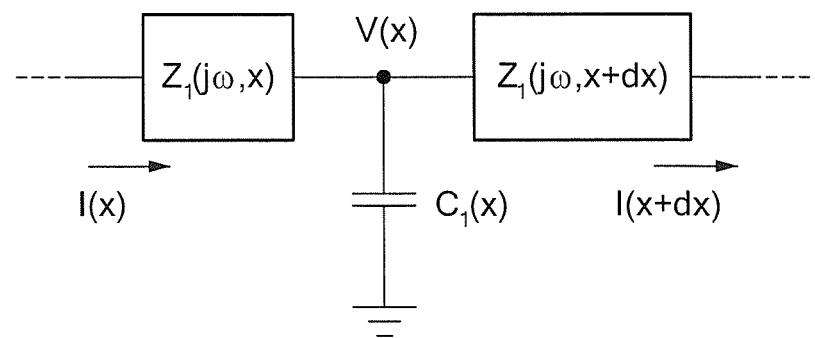
FIG. 14A is block diagram of a modified bidirectional cochlear structure obtained using an impedance-admittance (I □□↔ V) transformation.

FIG. 14A illustrates the resulting alternative cochlear structure, where Z 1(s)=1/Z(s) and the shunt capacitances $C_1(x)$ increase exponentially with position x. As a result, the normalized shunt impedance is Z1s=1/Z s=1/(γs). This structure is particularly suitable for integrated circuit implementations since unavoidable parasitic capacitances can be absorbed into C 1, the shunt capacitance of the transmission line.

Another related cochlear structure can be obtained by subjecting the impedances in the model to a filter transformation that converts low-pass responses to high-pass responses, and vice-versa.

Figure 14B:
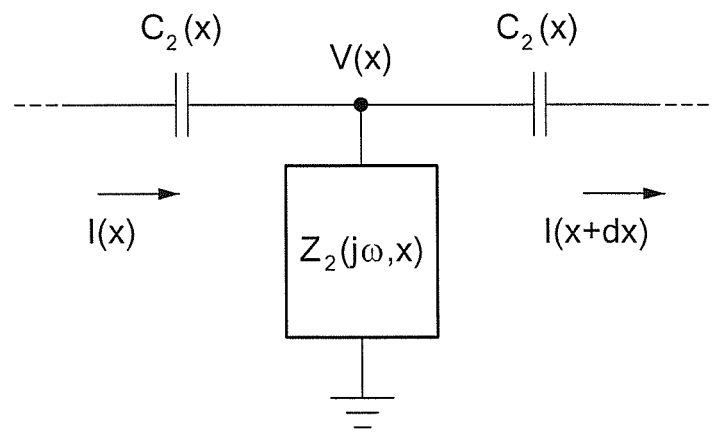
FIG. 14B is block diagram of a modified bidirectional cochlear structures, obtained using a low-pass to high-pass filter (s□↔ 1/s) transformation.

FIG. 14B illustrates the resulting structure, where Z 2(s)=Z (1/s) and the series capacitances C 2(x) decrease exponentially with position x. This is a high-pass cochlea where the low frequencies peak towards the beginning and high frequencies towards the end, which is the reverse of what happens in the other cochlear structures. It may be of interest for reducing chip layout area since it minimizes the number of magnetic components (inductors and transformers, both of which are area-hungry) required by the system.

The cochlear structures shown in FIGS. 13 and 14 are continuous transmission lines. In practice, a truly continuous implementation is always infeasible since only a finite number of active components can be used. At extremely high frequencies (e.g. frequencies at or above about 10 GHz) all passive components of the cochlea can be incorporated into a continuous transmission line; the only lumped elements needed are the active circuit elements. However, at frequencies below about 10 GHz, a continuous transmission line becomes physically too large for implementation in integrated circuit form. Therefore discretized versions of the bidirectional cochlea have been implemented, where a fixed, finite number of lumped, active impedances ("stages") are used to cover a given frequency ratio (such as an octave). Say $N_{nat}$ of stages per octave is $N_{oct}$ is the number of stages for every factor of e in frequency. Then the number of stages per octave is $N_{oct}=N_{nat}$, and the total number of stages is $N=N_{nat} \ln(\beta)$. For example, a particular cochlea may contain 72 stages with 12 stages per octave, enabling it to span a frequency range of 6 octaves ($\beta=64$).

The bidirectional structure in FIG. 13A can support traveling waves in both forward and backward directions. We now assume, based on knowledge of the biological cochlea, that only forward-traveling waves are important for spectrum analysis. The bidirectional cochlear structure can then be simplified to the unidirectional filter-cascade structure shown in FIG. 13B. Each unidirectional filter has the following normalized input-output transfer function:

$$H(s)=1/(1+\beta(s(s+\mu))/(s^2+2ds+1))$$ Equation (5)

where $\beta>0$ is a constant that depends upon the rate of exponential tapering of the cochlea and how finely the underlying differential equations were discretized to create the lumped approximation shown in the figure. Just as in the discretized bidirectional cochlea, a fixed number of filter stages are used to cover any frequency ratio (such as an octave). Transmission zeros present in Equation (5) increase the frequency resolution of the RF cochlea compared to when simple resonant low-pass filters are used.

The cochlea is energy-efficient because it uses distributed gain to get a large gain-bandwidth product. Following is a comparison of the power consumption of the bidirectional RF cochlea with an all-digital software-defined radio which has the same speed (bandwidth) and precision (signal-to-noise ratio or number of bits). To directly digitize 7 GHz of bandwidth with 50 dB of dynamic range, we need 16 GS/s and 9 bits of precision. This step requires 7 W even if a state-of-the-art ADC that consumes only 1 pJ/quantization level is assumed. By contrast, the bidirectional RF cochlea has a bandwidth of 7 GHz and an output SNR of greater than 50 dB but only consumes 180 mW of power.

The RF cochlea has higher dynamic range than audio-frequency silicon cochleas, mainly because integrated passive inductors can be used at RF. Active inductors, which produce Q times as 12 much noise as passive inductors with the same quality factor Q, must be used at audio. Nevertheless, cochlea-like structures that take advantage of the ideas described herein can also be used for spectral analysis at lower frequencies.

Different process technologies are optimally suited for hardware implementations of the cochlea at various frequency ranges. For example, MEMS cochleas using masses and springs are attractive at audio (in the kHz range). Power-efficient electronic implementations at these frequencies are also possible using analog subthreshold MOS circuits. Similar circuits using BJT's are suitable for ultrasonic and VHF cochleas. MOS and BJT cochleas can be realized using either voltage-mode or current-mode signal processing. Implementations that are partially or completely digital are also possible. Described herein are complementary metal-on-semiconductor (CMOS) RF cochleas that use lumped transmission lines and passive LC filters. These structures are best suited for ultra-high frequency (UHF) and low-GHz frequencies. Above about the 10 GHz frequency range, distributed cochleas using true transmission lines and high-speed compound semiconductor devices become feasible.

Both unidirectional and bidirectional RF cochleas have been designed and implemented in MOS technology. In one exemplary embodiment, the bidirectional cochlea structure shown in FIG. 14A was implemented using CMOS technology.

Figure 15A:
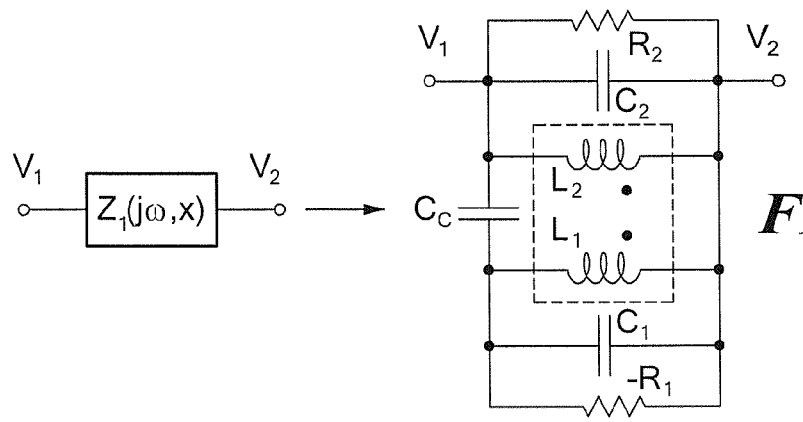
FIG. 15A is schematic diagram of a single bidirectional RF cochlea series impedance element having an active component represented as a negative resistance □□.
Figure 15B:
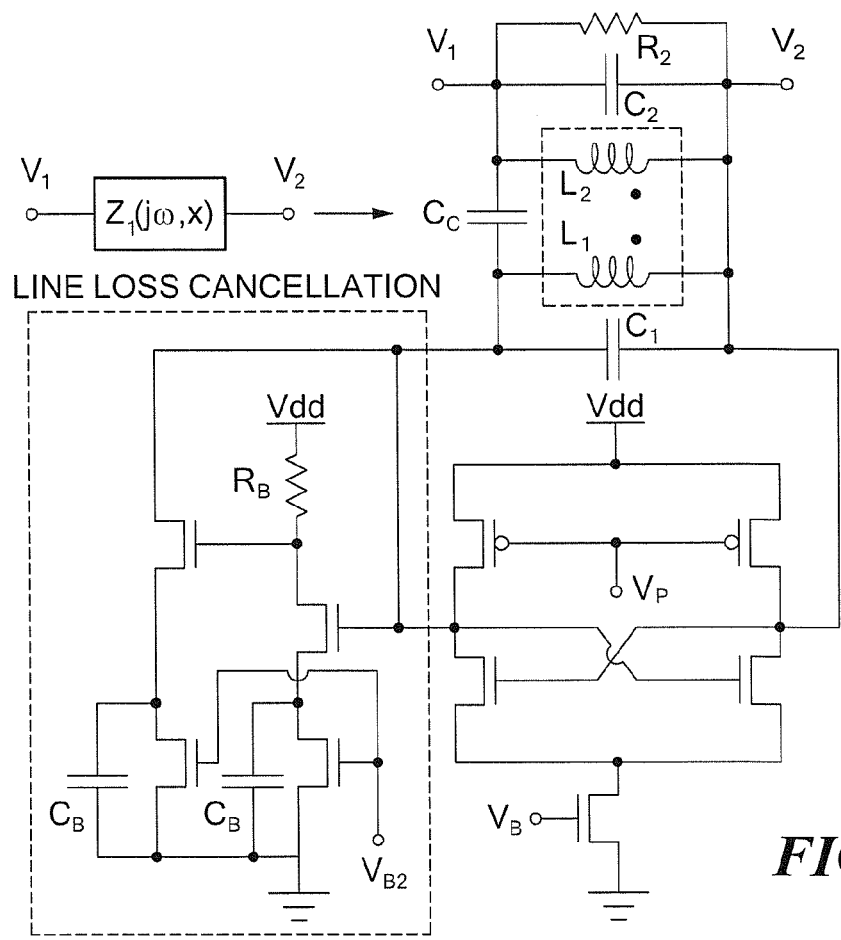
FIG. 15B is schematic diagram of a single bidirectional RF cochlea series impedance element implemented with transistors realizing the negative resistance and including circuits for canceling series line loss.

FIGS. 15A, 15B illustrate different circuit implementations of a single series element having an impedance characteristic corresponding to $Z_1(j\omega,x)$.

Referring first to FIG. 15A, a schematic diagram of a single bidirectional RF cochlea series impedance element includes a resistor $R_2$, and a pair of capacitors $C_1$, $C_2$, parallel coupled between a pair of reference voltages $V_1$ and $V_2$. A transformer provided from a pair of inductors $L_1$, $L_2$ and a capacitor $C_c$ is also coupled between the reference voltages $V_1$, $V_2$. In the circuit of FIG. 15A, a negative resistance □□-$R_1$ represents an active component of the single series element.

Referring next to FIG. 15B, a schematic diagram of a single bidirectional RF cochlea series impedance element using a CMOS implementation, with transistors realizing the negative resistance. The circuit includes a line loss cancellation structure 1510 which implements a negative resistance that compensates for losses associated with a finite quality factor (Q) of the integrated passive components used to realize the impedance element $Z_1$.

Figures 16A, 16B, 16C:
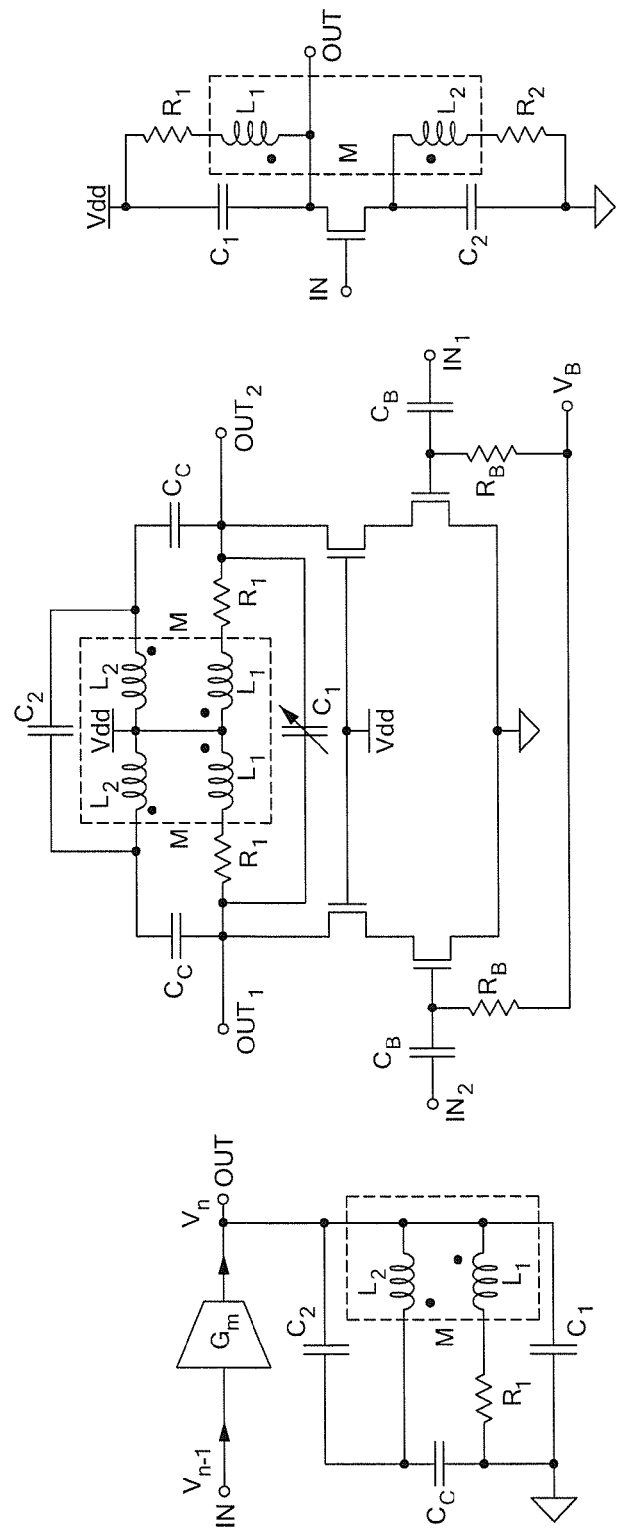
FIG. 16A is a circuit schematic of a single unidirectional RF cochlea stage with G m=1/$R_1$ being the transconductance of a unidirectional buffer between $V_{n-1}$ and $V_n$.
FIG. 16B is a circuit schematic of a single unidirectional RF cochlea stage implemented using differential CMOS technology.
FIG. 16C is a circuit schematic of a single unidirectional RF cochlea stage using an alternative, single-ended CMOS implementation.

Similarly, FIGS. 16A-16C show two different ways by which a single unidirectional cochlear filter stage can be implemented. The transformer comprising of L 1 and L 2 can be realized on-chip using spirals implemented on different metal layers and laid out to overlap with each other.

Table III below summarizes the simulated performance of both hardware implementations.

TABLE III

| SIMULATED PERFORMANCE OF THE RF COCHLEA | | |
|---|---|---|
| Parameter | Unidirectional | Bidirectional |
| Fabrication process | UMC 0.13 µm RF-CMOS | UMC 0.13 µm RF-CMOS |
| Center frequency range | 7 GHz-40 MHz | 9 GHz-800 MHz |
| Stages per octave | 12 | 14 |
| Number of stages | 50 | 50 |
| Individual stage Q | 1.5 | — |
| Frequency selectivity: system $Q_{10\,dB}/Q_{3\,dB}$ | 2.5/5 | 7.5/15 |
| Output noise | <2 mV$_{rms}$ | <300 µmV$_{rms}$ |
| Output SNR | >50 DbB | >50 dB |
| Transfer function gain | 20 dB | 0 dB |
| Maximum input signal | 700 mV$_{rms}$ | 700 mV$_{rms}$ |
| Input-referred dynamic range | 71 dB | 67 dB |
| Power consumption | 90 mW | 180 mW |
| Input impedance | 50 Ω | 50 Ω |

It should be noted that input-referred dynamic range values are computed as 200 µV$_{rms}$–700 mV$_{rms}$=71 db and 300 µV$_{rms}$–700 mV$_{rms}$=67 db, respectively. It should also be appreciated that the unidirectional structure is simpler to implement, is guaranteed to be stable and has lower power consumption but is inferior to the bidirectional version in terms of frequency resolution.

Figure 17:
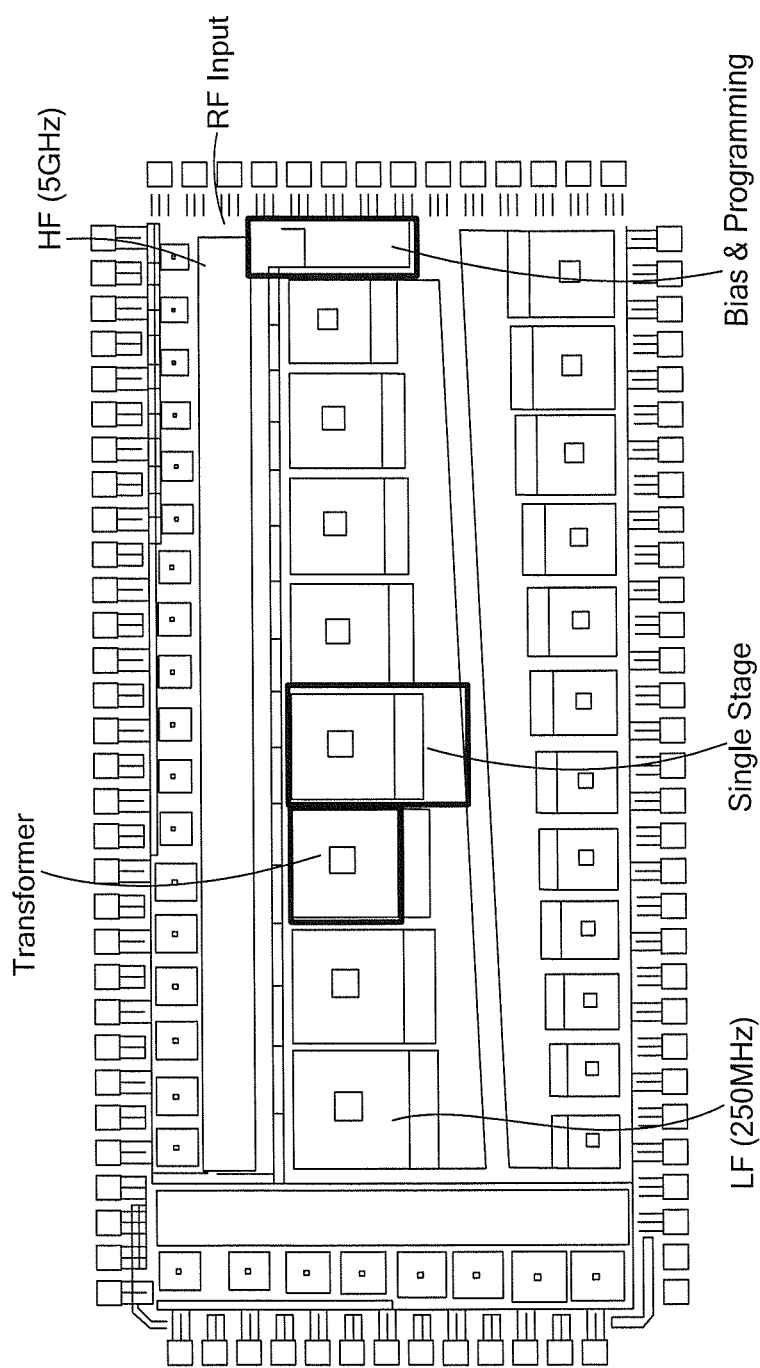
FIG. 17 is an image of a die of a working unidirectional RF cochlea chip.

Referring now to FIG. 17 a labeled die photograph of a unidirectional RF cochlea chip is shown. This chip has been tested and found to be functional.

Figure 18:
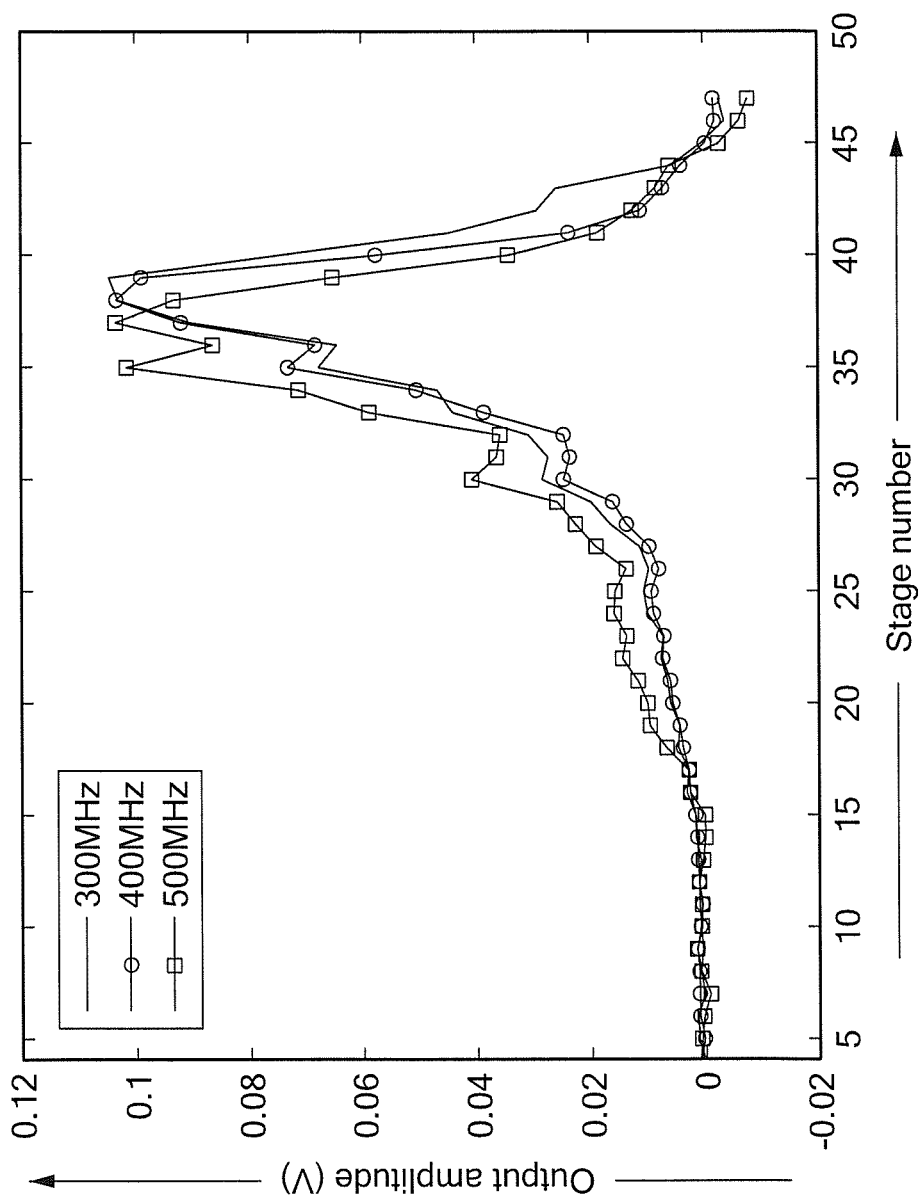
FIG. 18 is a plot of output amplitude (in volts) vs. stage number for measured (experimental) outputs (spatial response) of a unidirectional RF cochlea in response to single input tones of different frequencies.

Referring now to FIG. 18, measured spatial responses of the cochlea to single input tones varying from 300 MHz to 500 MHz are shown. It should be noticed that the peak position moves toward the as the input frequency increases from 300 MHz to 500 MHz. This indicates that the RF cochlea is functioning as a spectrum analyzer. The cochlea chip has also been coupled to a broadband log-periodic antenna. It has been shown that this system can receive RF signals from the environment and separate them based on spectral content.

Several enhancements of the basic RF cochlea structure are next discussed. It should be appreciated and understood that the enhancements next described apply to both unidirectional or bidirectional cochlear structures (unless mentioned otherwise). One important characteristic of the RF cochlea is masking, where the presence of a strong tone suppresses the response to smaller tones both above and below it in frequency. However, the low-pass response of the cochlea means that masking is asymmetric—i.e. tones having a relatively low frequency and a relatively large amplitude tend to effectively suppress tones having a relatively high frequency and a relatively small amplitude while the reverse is not generally true (i.e. tones having a relatively high frequency and a relatively large amplitude do not tend to effectively suppress tones having a relatively low frequency and a relatively small amplitude).

Figure 19A:
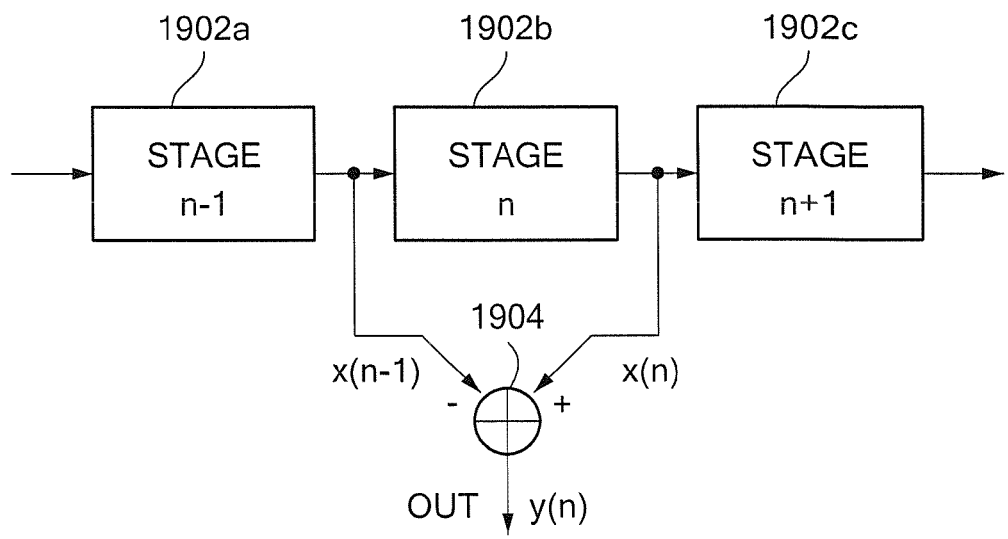
FIG. 19A is block diagram of a linear spectral sharpening scheme for the RF cochlea.

Referring now to FIG. 19A, a plurality of cochlea stages 1902a, 1902b, 1902c are coupled in series. The input and out of cochlea stage 1902b are coupled to difference and sum ports, respectively of a subtractor circuit 1904. The subtractor circuit 1904 provides a difference signal $y(n)=x(n)-x(n-1)$ at an output thereof. With this approach, the difference in output signals (vs. the output signal itself) is used across each cochlear stage as the output. This converts the low-pass cochlear response to a band-pass one. Thus, by using the difference in output signals across each cochlear stage as the output, not the signal itself, this circuit modifies the above-described asymmetric behavior.

Figure 19B:
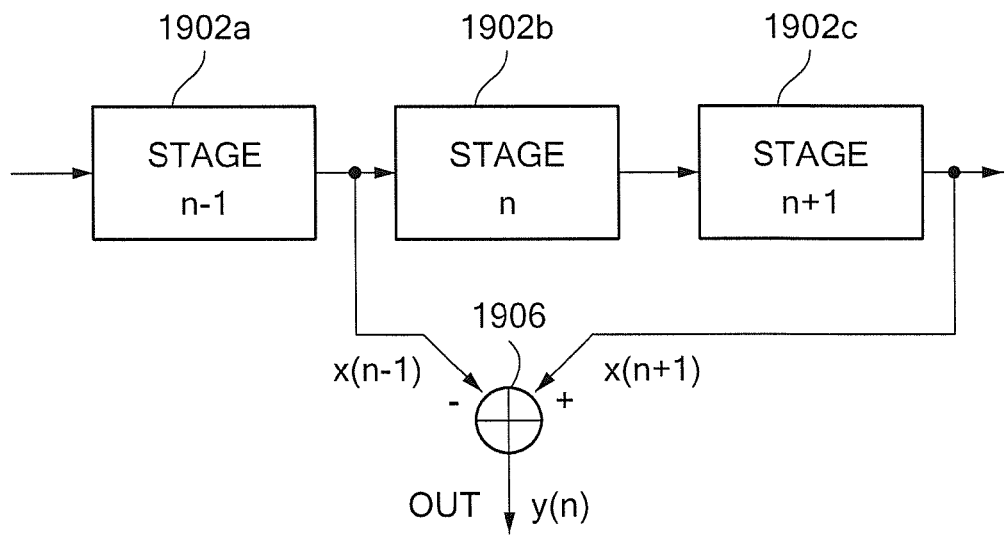
FIG. 19B is block diagram of a nonlinear spectral sharpening scheme for the RF cochlea.
Figure 20:
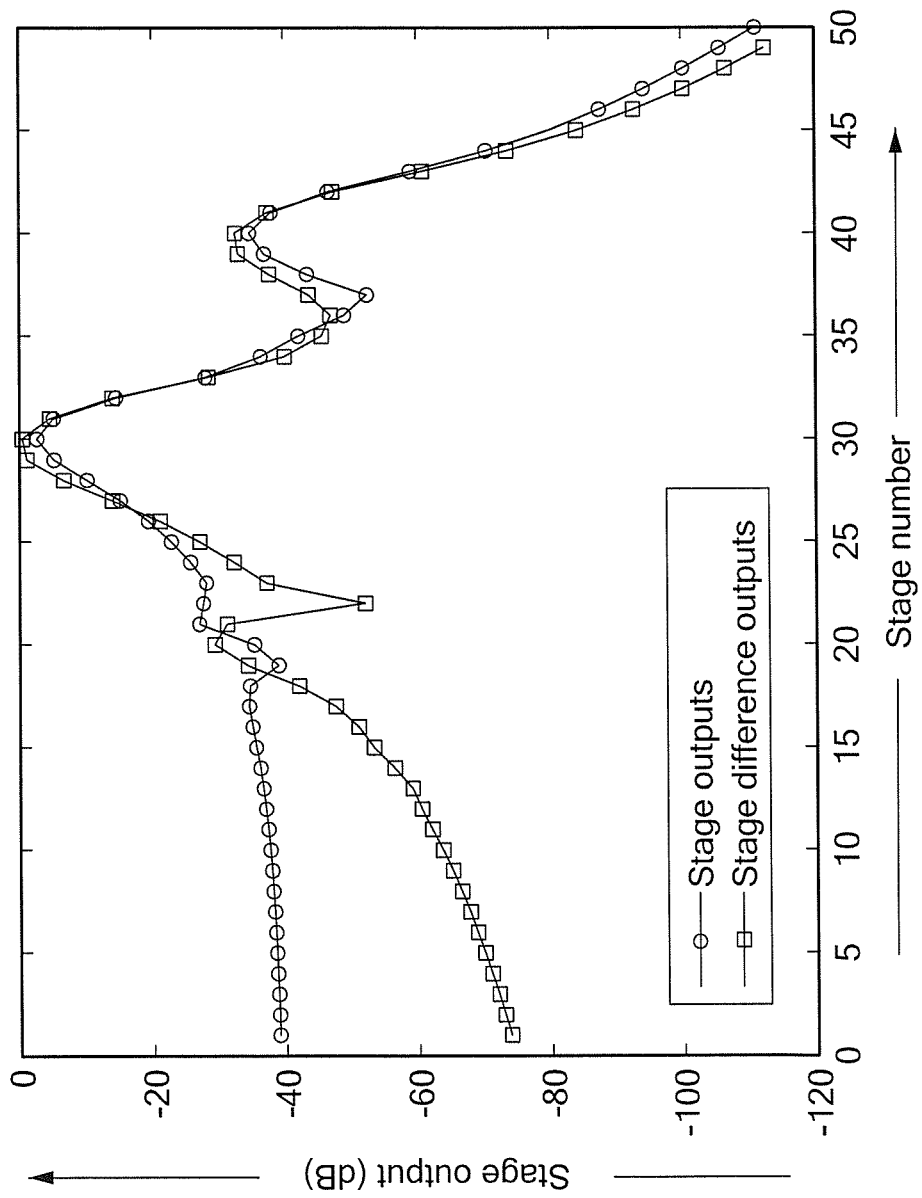
FIG. 20 is a plot of simulated stage outputs (spatial response) vs. stage number for a unidirectional RF cochlea in response to three input tones spaced one octave apart with the middle tone being 30 dB larger than the other two.

Referring now to FIG. 20, simulated results are shown for the unidirectional cochlea described in conjunction with FIG. 19 above. The small, highest-frequency tone is normally almost drowned out; however it is resolved clearly when stage differences are used as outputs.

In addition to the linear filtering provided by the RF cochlea, nonlinear spectral sharpening strategies can also be used. These techniques can further improve the frequency selectivity of the system. One strategy, inspired by the action of coincidence-detecting cells in the biological cochlear nucleus, is shown in FIG. 19B. Outputs of cochlear stages 1902a, 1902c two positions apart in the cascade are multiplied together via a multiplier circuit 1906 to produce an output signal $y(n)=x(n+1)-x(n-1)$. The multipliers 1906 act as analog correlators that detect phase-coincidence, thus combining phase and magnitude information present in the cochlear outputs. It can be shown that this strategy approximately doubles the frequency resolution with no loss in timing precision.

Figure 21:
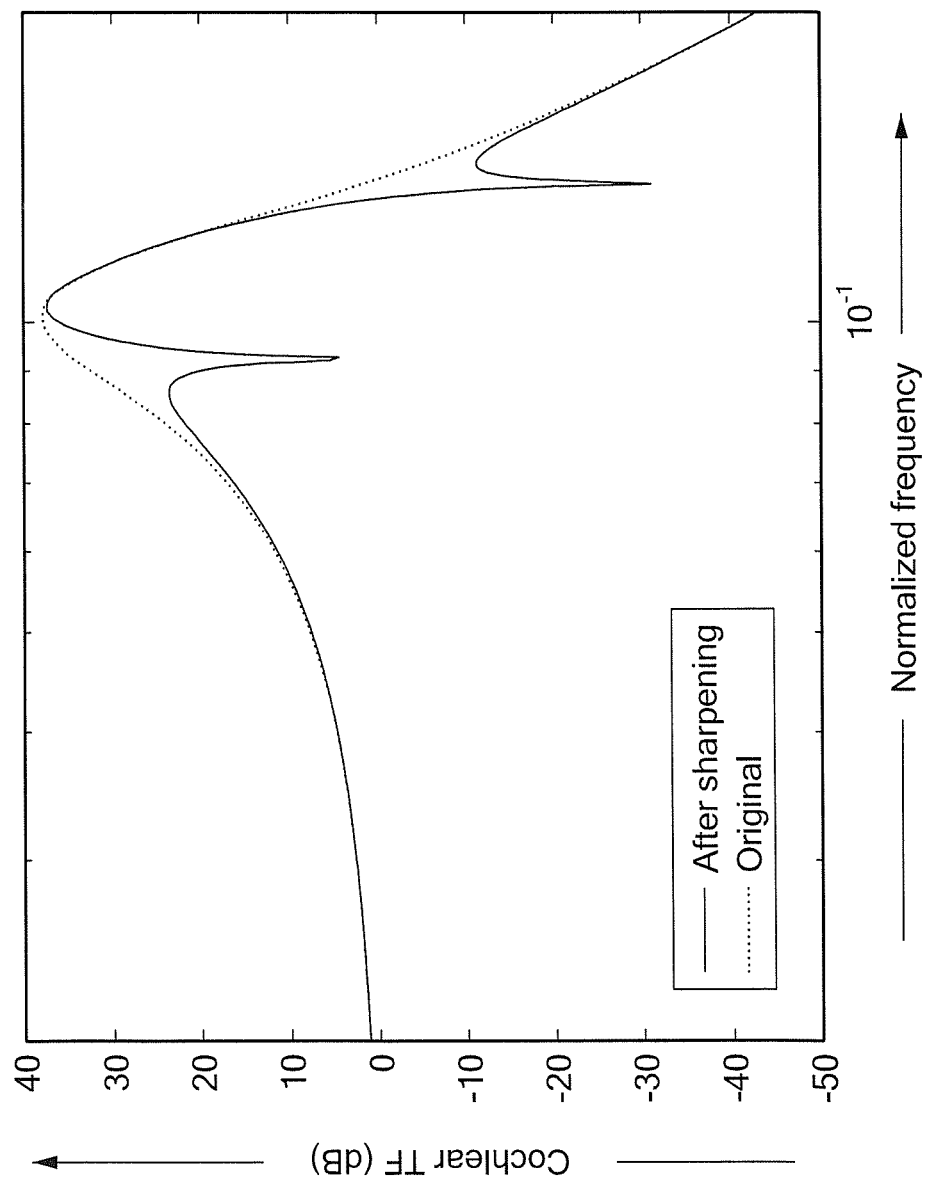
FIG. 21 is a plot of simulated unidirectional cochlea transfer functions (TF) vs. normalized frequency at different spatial locations before and after spectral sharpening.

Referring now to FIG. 21, simulation results of the circuit of FIG. 19B are shown. By comparing the plots shown in FIGS. 20 and 21, it can be seen that the results of FIG. 21 are sharpened compared with the results of FIG. 20.

Finally, active transmission line structures like the bidirectional RF cochlea can be used to build a tunable RF laser. An "RF laser" refers to a distributed oscillator that can produce multiple output frequencies simultaneously. The frequencies do not have to be harmonically related to each other and can be individually tuned if necessary. The bidirectional RF cochlea structure is functionally similar to a laser or maser cavity because it is an active, frequency-selective medium that can amplify certain propagating wave modes (i.e., frequencies) by pumping energy into them. Impedance-mismatched terminations at the two ends of the cochlea act like the reflecting faces of a laser cavity. Such RF lasers referred to above, may be used for generating radar chirps or pulses that can be used for ultra-wideband or impulse radio.

When used for spectral analysis the gain of the cochlear stages is kept low enough that no frequency components get enough gain to become unstable. To build an RF laser the gain of selected sections of the cochlea is increased till instability results and the system begins to oscillate. In order to increase gain, the values of the negative resistances shown in FIG. 15 can be decreased. When configured in laser mode the RF cochlea can be periodically turned on and off to produce trains of narrow pulses (modulated wave-packets). These pulses can be used as signal sources in ultra-wideband or impulse radio applications. In addition, the instantaneous frequency within each pulse can be varied with time to produce chirp waveforms that are useful for radar.

Figure 22:
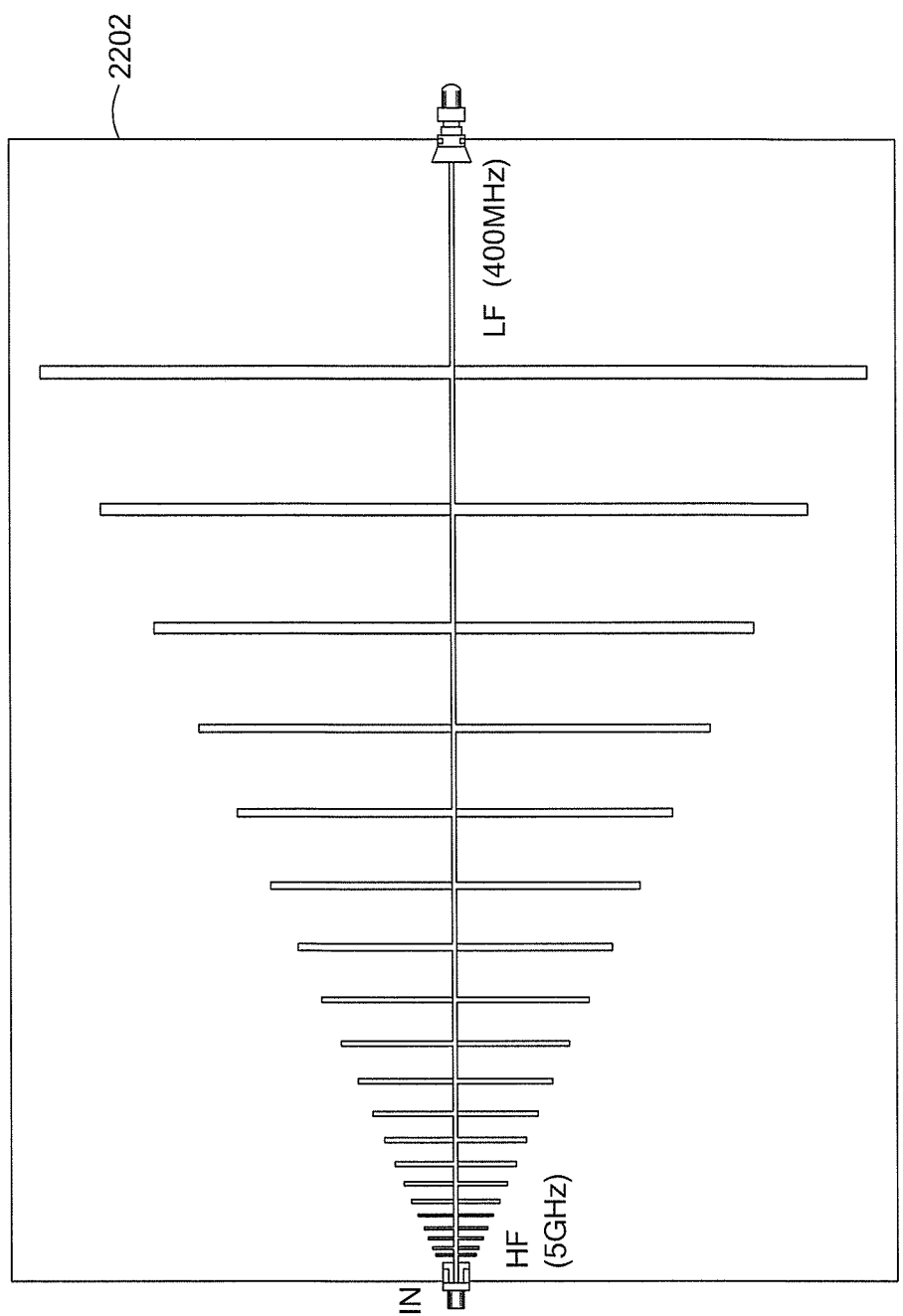
FIG. 22 is a plan view of a planar, broadband log-periodic dipole antenna that can be interfaced with the RF cochlea for collecting radiated RF energy from the environment.

Referring now to FIG. 22, a planar log-periodic dipole antenna 2202 is provided from a double-sided printed circuit board 2204 (i.e. a printed circuit board having a conductive material disposed on both sides thereof), having strip conductors 2206 patterned or otherwise provided in a predetermined pattern on both sides of the printed circuit board. The antenna (17"□×12.5" in size) was measured to be impedance-matched to 50Ω (VSWR<2) from 400 MHz to 6 GHz and have an average gain of 5 dBi over this bandwidth.

The antenna 2202 captures radiated RF signals from the environment and feeds the signals into an RF cochlea. Similar antennas have been successfully interfaced with the unidirectional RF cochlea chip shown in FIG. 17.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims.

The invention claimed is:

1. An apparatus having an input and comprising:
    a cascaded super-heterodyne apparatus for estimating a frequency and a bandwidth of signals proximate in frequency to a desired signal, cascaded super-heterodyne apparatus comprising:
        M filter banks with each of said M filter banks comprising N filters such that each of said M filter banks provides N output signals such that the cascaded super-heterodyne apparatus is adapted to monitor N signals of interest in parallel and wherein the output signals of each of said M filter banks are bandpass signals having a center frequency;
        a mixer coupled to the output of each of said M filter banks such that each mixer receives a corresponding one of each of the N output signals from each of said M filter banks wherein the mixers increase a spectral resolution of the apparatus by a factor of $\alpha^M$ and wherein the bandwidth of each of the bandpass signals is successively reduced by the mixers and succeeding filter bank;
        N digitally controlled oscillators (DCOs) coupled to provide signals to each of said mixers; and
        a decision network coupled to receive signals from said M filter banks and to provide signals to said DCOs;
    a tunable filter coupled to an input of a receiver; and a tuner which receives a signal from said cascaded superheterodyne apparatus and tunes the filter to filter out unwanted signals from the receiver.

2. The apparatus of claim 1 wherein said cascaded superheterodyne apparatus uses successive approximation to perform hierarchical, parallel estimation of multiple frequencies.

3. The apparatus of claim 1 wherein the decision network comprises:

M frequency comparators, each of the frequency comparators adapted to receive an input signal from a corresponding one of the M filter banks; and M oscillators each of the oscillators coupled to receive an output signal from a corresponding one of said M comparators;

M mixer circuits, each of the M mixer circuits coupled to receive a first input signal from a corresponding one of said M oscillators and a second input signal from a corresponding one of said M filter banks; and M circuits, each of said M filter circuits coupled to receive an output signal from a corresponding one of said mixer circuits and to provide a filtered output signal at an output port of said decision network.

4. The apparatus of claim 1 wherein the cascaded superheterodyne apparatus includes a frequency estimator apparatus having an input, the frequency estimator apparatus comprising:

one or more conversion stages, each conversion stage comprising:

a frequency comparator adapted to receive a first signal $\omega_{n-1}$, at a first input port thereof and a second signal $\omega_{REF}$ at a second input thereof and in response thereto, said frequency comparator provides at least one output bit $b_{n-1}$ at an output thereof;

a digitally controlled oscillator (DCO) having an input coupled to the output of said frequency comparator wherein in response to the signal provided thereto from said frequency comparator, said DCO provides an output signal;

a mixer adapted to receive the DCO output signal at a first input port and the first signal $\omega_{n-1}$ at a second input port and in response thereto, said mixer provides sum and difference frequency signals at an output port thereof;

a filter having a bandpass filter characteristic, a center frequency corresponding to $\omega_{REF}/2$ and a frequency bandwidth B, said filter adapted to receive the output of said mixer at an input thereof and to provide a filtered output signal at an output thereof, an amplifier circuit adapted to receive the filtered output signal from said filter and to provide an amplified output signal at an output thereof.

5. The apparatus of claim 4 wherein said conversion stage is a first stage of a plurality of like conversion stages, each of said conversion stages coupled in series and wherein:

the first signal $\omega_{n-1}$ corresponds to an output of a previous conversion stage and the second signal $\omega_{REF}$ corresponds to a center frequency;

said amplifier circuit amplifies the filtered signal by a factor of two to produce an output signal $\omega_n$, which may then be provided as an input to a next conversion stage; and said digitally-controlled oscillator (DCO) produces a signal corresponding to $\omega_{DCO} = (\omega_{REF} + b_{n-1}B)/2$.

6. The apparatus of claim 5 wherein said frequency comparator and said DCO correspond to multiple bit devices such that each of said conversion stages provides multiple output bits.

7. The apparatus of claim 5 wherein the frequency estimator apparatus further comprises a plurality of sample and hold circuits with a first one of said plurality of sample and hold circuits coupled to the input of the first conversion stage and next ones of said plurality of sample and hold circuit are coupled between each of said conversion stages.

8. The apparatus of claim 4 wherein at least one conversion stage provides an output signal at a first port thereof and a residue signal at a second port thereof and wherein the frequency estimator apparatus further comprises a sample and hold circuit having an output port coupled to an input of the at least one conversion stage and having an input port selectively coupled to an input of the frequency estimator apparatus and to the second port of the at least one conversion stage.

9. The apparatus of claim 1 wherein the cascaded superheterodyne apparatus includes a dual-slope frequency estimator, the frequency estimator comprising:

a digital frequency source adapted to ramp-up an input frequency $\omega_{in}$ for a fixed time $T_{ref}$ during a first phase;

a digital frequency source adapted to ramp-down a reference frequency $\omega_{ref}$ during a second phase in time; and an encoder which encodes the value of the input frequency at the time at which the input frequency $\omega_{in}$ and the reference frequency $\omega_{ref}$ are equal.

10. The apparatus of claim 9 wherein said first and second digital frequency sources are frequency synthesizers.

11. The apparatus of claim 1 wherein the cascaded superheterodyne apparatus includes a sigma-delta frequency-to-digital converter having an input port and an output port, the sigma-delta frequency-to-digital converter comprising:

a complex multiplier circuit which receives an input signal $\omega_{IN}$ and provides an output signal $\omega_{ERR}$ at an output port thereof;

a delay block coupled to receive the output signal $\omega_{ERR}$ from said complex multiplier circuit and to provide a delayed version of the output signal $\omega_{ERR}$ from said complex multiplier circuit;

a divider coupled to receive the output signal $\omega_{ERR}$ from said complex multiplier circuit and to receive the delayed version of the output signal $\omega_{ERR}$ from said complex multiplier circuit;

an angle resolver adapted to receive the output from said divider and to provide a phase resolved error signal at an output thereof;

an integrator coupled to receive the phase resolved error signal from said angle resolver and to provide an integrated signal at an output thereof;

a comparator coupled to receive the integrated signal from said integrator at a input thereof and to receive a reference signal at a second input thereof and to provide an output signal in response to the two input signals provided thereto;

a digitally controlled oscillator (DCO) having an input coupled to the output of said comparator and having an output coupled to said complex multiplier circuit such that said DCO forms a feedback loop with said complex multiplier circuit; and a digital filter adapted to receive the output signal from said comparator and to provide an output signal at the output port of the sigma-delta frequency-to-digital converter.

12. The apparatus of claim 11 wherein said integrator, said comparator, said DCO, or a combination thereof are adapted to process multiple bits.

13. The apparatus of claim 11 wherein said delay circuit is provided as one of:

a discrete time element; and a continuous time delay element.

14. The apparatus of claim 1 wherein the cascaded super-heterodyne apparatus includes a cascaded-cochleas apparatus, the cascaded-cochleas apparatus comprising
- a first cochlea circuit having an input coupled to the input of the cascaded-cochleas apparatus and having a plurality of outputs;
- a decision network coupled to one of said plurality of outputs of said first cochlea circuit;
- a plurality of mixer circuits, each of said plurality of mixer circuits adapted to receive a respective one of a plurality of output signals provided at respective ones of the plurality of cochlea circuit outputs;
- alike plurality of digitally controlled oscillators (DCOs), each of said plurality of DCOs adapted to receive an input signal from said decision network and to provide a second signal to a respective one of said mixers wherein each of said plurality of mixer circuits provides an output signal at an output port thereof;
- a second cochlea circuit coupled to receive the output signal at the output port of each of said plurality of mixer circuits and to provide a signal to said decision network, said second cochlea circuit providing a plurality of output signals.

15. The apparatus of claim 14 wherein the cascaded-cochleas apparatus further comprises a cancellation circuit coupled to the input of the cascaded-cochleas apparatus, said cancellation circuit for removing undesirable signals prior to reaching said first filter bank.

16. The apparatus of claim 14 wherein the cascaded-cochleas apparatus further comprises one or more filters coupled in series between the input of the cascaded-cochleas apparatus and the input of the first cochlea circuit.

17. The apparatus of claim 16 wherein at least one of the filters is provided as tunable filter and the cascaded-cochleas apparatus further comprises a tuner having an input coupled to receive a signal from said decision network and an output coupled to a tuning port of each of said one or more tunable filters wherein said tuner uses the signal from the decision network to tune the filters filter undesirable signals prior to reaching said first fitter bank.

18. The apparatus of claim 16 wherein at least one of the filters has a notch filter characteristic.

19. An apparatus having an input and comprising:
- a cascaded super-heterodyne apparatus for estimating a frequency and a bandwidth of signals proximate in frequency to a desired signal, the cascaded super-heterodyne apparatus comprising:
  - M filter banks with each of said M filter banks comprising N filters such that each of said M filter banks provides N output signals such that the cascaded super-heterodyne apparatus is adapted to monitor N signals of interest in parallel and wherein the output signals of each of said M filter banks are bandpass signals having a center frequency;
  - a mixer coupled to the output of each of said M filter banks such that each mixer receives a corresponding one of each of the N output signals from each of said M filter banks wherein said mixers increase a spectral resolution of the apparatus and wherein the bandwidth of each of the bandpass signals is successively reduced by the mixers and succeeding filter bank;
  - N digitally controlled oscillators (DCOs) coupled to provide signals to each of said mixers; and
  - a decision network coupled to receive signals from said M filter banks and to provide signals to said DCOs;
- a tunable filter coupled to an input of a receiver; and
- a tuner which receives a signal from said cascaded super-heterodyne apparatus and tunes the filter to filter out unwanted signals from the receiver.

20. The apparatus of claim 19 wherein said cascaded super-heterodyne apparatus uses successive approximation to perform hierarchical, parallel estimation of multiple frequencies.

21. The apparatus of claim 19 wherein the decision network comprises:
- M frequency comparators, each of the frequency comparators adapted to receive an input signal from a corresponding one of the M filter banks; and
- M oscillators each of the oscillators coupled to receive an output signal from a corresponding one of said M comparators;
- M mixer circuits, each of the M mixer circuits coupled to receive a first input signal from a corresponding one of said M oscillators and a second input signal from a corresponding one of said M filter banks; and
- M filter circuits, each of said M filter circuits coupled to receive an output signal from a corresponding one of said M mixer circuits and to provide a filtered output signal at an output port of said decision network.

22. The apparatus of claim 19 wherein the cascaded super-heterodyne apparatus includes a dual-slope frequency estimator, the frequency estimator comprising:
- a digital frequency source adapted to ramp-up an input frequency $\omega_{in}$ for a fixed time $T_{ref}$ during a first phase;
- a digital frequency source adapted to ramp-down a reference frequency $\omega_{ref}$ during a second phase in time; and
- an encoder which encodes the value of the input frequency at the time at which the input frequency $\omega_{in}$ and the reference frequency $\omega_{ref}$ are equal.

* * * * *